US010557594B2

(12) United States Patent
Li

(10) Patent No.: US 10,557,594 B2
(45) Date of Patent: Feb. 11, 2020

(54) SOLID-STATE LAMPS UTILIZING PHOTOLUMINESCENCE WAVELENGTH CONVERSION COMPONENTS

(71) Applicant: Intematix Corporation, Fremont, CA (US)

(72) Inventor: Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 15/815,577

(22) Filed: Nov. 16, 2017

(65) Prior Publication Data

US 2018/0328548 A1 Nov. 15, 2018

Related U.S. Application Data

(63) Continuation of application No. 14/136,972, filed on Dec. 20, 2013, now abandoned.

(Continued)

(51) Int. Cl.
*F21K 9/64* (2016.01)
*F21K 9/232* (2016.01)

(Continued)

(52) U.S. Cl.
CPC ................ *F21K 9/64* (2016.08); *F21K 9/232* (2016.08); *F21K 9/233* (2016.08); *G02B 6/00* (2013.01);

(Continued)

(58) Field of Classification Search
CPC .......... F21K 9/64; G02B 6/0096; H01L 33/50
See application file for complete search history.

(56) References Cited

U.S. PATENT DOCUMENTS 3,290,255 A 12/1966 Smith
3,593,055 A 7/1971 Geusic et al.

(Continued)

FOREIGN PATENT DOCUMENTS

CA 2466979 11/2005
CN 1777999 A 5/2006

(Continued)

OTHER PUBLICATIONS

Armaroli, N. et al., "Supramolecular Photochemistry and Photophysics. ", "J. Am. Chern. Soc.", 1994, pp. 5211-5217, vol. 116.

(Continued)

*Primary Examiner* — Anh T Mai
*Assistant Examiner* — Zachary J Snyder
(74) *Attorney, Agent, or Firm* — Vista IP Law Group, LLP

(57) ABSTRACT

Disclosed are improved photoluminescence wavelength conversion components and lamps that incorporate such components. The photoluminescence wavelength conversion component comprises a hollow cylindrical tube having a given bore of diameter and an axial length. The relative dimensions and shape of the component can affect the radial emission pattern of the component and are configured to give a required emission pattern (typically omnidirectional). The photoluminescence material can be homogeneously distributed throughout the volume of the component during manufacture of the component. An extrusion method can be used to form the improved photoluminescence wavelength conversion component. Injection molding or casting can also be used to form the component. Another possible approach is to manufacture the component is by forming a flexible sheet material to include the phosphor and/or quantum dots, and then rolling the sheet material into the desired shape and dimensions for the component. The improved (Continued)

200
190
270
180
190
190
190 wavelength conversion components and lamps that incorporate these components provide for improved emission characteristic, while allowing for relatively cost-effective manufacturing costs. A further advantage of components is that their light emission resembles a filament of a conventional incandescent light bulb.

13 Claims, 15 Drawing Sheets

Related U.S. Application Data

(60) Provisional application No. 61/746,986, filed on Dec. 28, 2012.

(51) Int. Cl.

| | |
|---|---|
| ***F21K 9/233*** | (2016.01) |
| ***G02B 6/00*** | (2006.01) |
| ***H01L 33/50*** | (2010.01) |
| ***F21V 8/00*** | (2006.01) |
| ***F21V 3/02*** | (2006.01) |
| ***F21V 7/04*** | (2006.01) |
| ***F21V 29/506*** | (2015.01) |
| ***F21V 29/70*** | (2015.01) |
| ***F21V 29/83*** | (2015.01) |
| *F21Y 115/10* | (2016.01) |

(52) U.S. Cl.
CPC ............ *G02B 6/0096* (2013.01); *H01L 33/50* (2013.01); *F21V 3/02* (2013.01); *F21V 7/048* (2013.01); *F21V 29/506* (2015.01); *F21V 29/70* (2015.01); *F21V 29/83* (2015.01); *F21Y 2115/10* (2016.08)

(56) References Cited

U.S. PATENT DOCUMENTS 3,670,193 A 6/1972 Thorington et al.
3,676,668 A 7/1972 Collins et al.
3,691,482 A 9/1972 Pinnow et al.
3,709,685 A 1/1973 Hercock et al.
3,743,833 A 7/1973 Martie et al.
3,763,405 A 10/1973 Mitsuhata
3,793,046 A 2/1974 Wanmaker et al.
3,819,973 A 6/1974 Hosford
3,819,974 A 6/1974 Stevenson et al.
3,849,707 A 11/1974 Braslau et al.
3,875,456 A 4/1975 Kana et al.
3,932,881 A 1/1976 Mita et al.
3,937,998 A 2/1976 Verstegen et al.
3,972,717 A 8/1976 Wiedemann
4,047,075 A 9/1977 Schober√
4,081,764 A 3/1978 Christmann et al.
4,104,076 A 8/1978 Pons
4,143,394 A 3/1979 Schoeberl
4,176,294 A 11/1979 Thornton, Jr.
4,176,299 A 11/1979 Thornton
4,191,943 A 3/1980 Cairns et al.
4,211,955 A 7/1980 Ray
4,305,019 A 12/1981 Graff et al.
4,315,192 A 2/1982 Skwirut et al.
4,443,532 A 4/1984 Joy et al.
4,559,470 A 12/1985 Murakami et al.
4,573,766 A 3/1986 Bournay, Jr. et al.
4,618,555 A 10/1986 Suzuki et al.
4,638,214 A 1/1987 Beers et al.
4,667,036 A 5/1987 Iden et al.
4,678,285 A 7/1987 Ohta et al.
4,727,003 A 2/1988 Ohseto et al.
4,772,885 A 9/1988 Uehara et al.
4,845,223 A 7/1989 Seybold et al.
4,859,539 A 8/1989 Tomko et al.
4,915,478 A 4/1990 Lenko et al.
4,918,497 A 4/1990 Edmond
4,946,621 A 8/1990 Fouassier et al.
4,992,704 A 2/1991 Stinson
5,077,161 A 12/1991 Law
5,110,931 A 5/1992 Dietz et al.
5,126,214 A 6/1992 Tokailin et al.
5,131,916 A 7/1992 Eichenauer et al.
5,143,433 A 9/1992 Farrell
5,143,438 A 9/1992 Giddens et al.
5,166,761 A 11/1992 Olson et al.
5,208,462 A 5/1993 O'Connor et al.
5,210,051 A 5/1993 Carter, Jr.
5,211,467 A 5/1993 Seder
5,237,182 A 8/1993 Kitagawa et al.
5,264,034 A 11/1993 Dietz et al.
5,283,425 A 2/1994 Imamura
5,369,289 A 11/1994 Tamaki et al.
5,371,434 A 12/1994 Rawlings
5,405,709 A 4/1995 Littman et al.
5,439,971 A 8/1995 Hyche
5,518,808 A 5/1996 Bruno et al.
5,535,230 A 7/1996 Abe
5,557,168 A 9/1996 Nakajima et al.
5,563,621 A 10/1996 Silsby
5,578,839 A 11/1996 Nakamura et al.
5,583,349 A 12/1996 Norman et al.
5,585,640 A 12/1996 Huston et al.
5,619,356 A 4/1997 Kozo et al.
5,660,461 A 8/1997 Ignatius et al.
5,677,417 A 10/1997 Muellen et al.
5,679,152 A 10/1997 Tischler et al.
5,763,901 A 6/1998 Komoto et al.
5,770,887 A 6/1998 Tadatomo et al.
5,771,039 A 6/1998 Ditzik
5,777,350 A 7/1998 Nakamura et al.
5,869,199 A 2/1999 Kido
5,947,587 A 9/1999 Keuper et al.
5,959,316 A 9/1999 Lowery
5,962,971 A 10/1999 Chen
5,998,925 A 12/1999 Shimizu
6,137,217 A 10/2000 Pappalardo et al.
6,147,367 A 11/2000 Yang et al.
6,252,254 B1 6/2001 Soules et al.
6,255,670 B1 7/2001 Srivastava et al.
6,340,824 B1 1/2002 Komoto et al.
6,361,186 B1 3/2002 Slayden
6,504,301 B1 1/2003 Lowery
6,538,375 B1 3/2003 Duggal et al.
6,555,958 B1 4/2003 Srivastava et al.
6,576,488 B2 6/2003 Collins et al.
6,576,930 B2 6/2003 Reeh et al.
6,580,097 B1 6/2003 Soules et al.
6,583,550 B2 6/2003 Iwasa et al.
6,600,175 B1 7/2003 Baretz et al.
6,614,170 B2 9/2003 Wang et al.
6,642,618 B2 11/2003 Yagi et al.
6,642,652 B2 11/2003 Collins et al.
6,653,765 B1 11/2003 Levinson et al.
6,660,332 B2 12/2003 Kawase et al.
6,680,569 B2 1/2004 Meueller-Mach et al.
6,709,132 B2 3/2004 Ishibashi
6,717,353 B1 4/2004 Mueller et al.
6,812,500 B2 11/2004 Reeh et al.
6,834,979 B1 12/2004 Cleaver et al.
6,860,628 B2 3/2005 Robertson et al.
6,869,812 B1 3/2005 Liu
6,903,380 B2 6/2005 Barnett et al.
7,029,935 B2 4/2006 Negley et al.
7,153,015 B2 12/2006 8rukilacchio
7,220,022 B2 5/2007 Allen et al.
7,311,858 B2 12/2007 Wang
7,390,437 B2 6/2008 Dong
7,479,662 B2 1/2009 Soules et al.
7,575,697 B2 8/2009 Li
7,601,276 B2 10/2009 Li
7,615,795 B2 11/2009 Baretz et al.
7,618,157 B1 11/2009 Galvez et al.

(56) References Cited

U.S. PATENT DOCUMENTS

| | | | |
|---|---|---|---|
| 7,655,156 | B2 | 2/2010 | Cheng |
| 7,663,315 | B1 | 2/2010 | Hulse |
| 7,665,865 | B1 | 2/2010 | Hulse et al. |
| 7,686,478 | B1 | 3/2010 | Hulse et al. |
| 7,943,945 | B2 | 5/2011 | Baretz et al. |
| 7,943,951 | B2 | 5/2011 | Kim et al. |
| 7,972,030 | B2 | 7/2011 | Li |
| 8,274,215 | B2 | 9/2012 | Liu |
| 8,931,933 | B2 | 1/2015 | Tong et al. |
| 9,512,970 | B2 | 12/2016 | Edwards |
| 2001/0000622 | A1 | 5/2001 | Reeh et al. |
| 2001/0002049 | A1 | 5/2001 | Reeh et al. |
| 2001/0033135 | A1 | 10/2001 | Duggal et al. |
| 2002/0047516 | A1 | 4/2002 | Iwasa et al. |
| 2002/0180351 | A1 | 12/2002 | McNulty et al. |
| 2003/0020101 | A1 | 1/2003 | Bogner et al. |
| 2003/0038596 | A1 | 2/2003 | Ho |
| 2003/0052595 | A1 | 3/2003 | Ellens et al. |
| 2003/0067264 | A1 | 4/2003 | Takekuma |
| 2003/0088001 | A1 | 5/2003 | Maekawa |
| 2003/0102810 | A1 | 6/2003 | Cross et al. |
| 2004/0012959 | A1 | 1/2004 | Robertson |
| 2004/0016908 | A1 | 1/2004 | Hohn et al. |
| 2004/0016938 | A1 | 1/2004 | Baretz et al. |
| 2004/0104391 | A1 | 6/2004 | Maeda et al. |
| 2004/0183081 | A1 | 9/2004 | Shishov |
| 2004/0190304 | A1 | 9/2004 | Sugimoto et al. |
| 2004/0227149 | A1 | 11/2004 | Ibbetson et al. |
| 2004/0227465 | A1 | 11/2004 | Menkara et al. |
| 2004/0239242 | A1 | 12/2004 | Mano |
| 2005/0051782 | A1 | 3/2005 | Negley et al. |
| 2005/0052885 | A1 | 3/2005 | Wu |
| 2005/0057917 | A1 | 3/2005 | Yatsuda et al. |
| 2005/0068776 | A1 | 3/2005 | Ge |
| 2005/0093430 | A1 | 5/2005 | Ibbertson et al. |
| 2005/0110387 | A1 | 5/2005 | Landry |
| 2005/0148717 | A1 | 7/2005 | Smith et al. |
| 2005/0168127 | A1 | 8/2005 | Shei et al. |
| 2005/0207166 | A1 | 9/2005 | Kan et al. |
| 2005/0239227 | A1 | 10/2005 | Aanegola et al. |
| 2005/0242711 | A1 | 11/2005 | Bloomfield |
| 2005/0243550 | A1 | 11/2005 | Stekelenburg |
| 2006/0001352 | A1 | 1/2006 | Maruta et al. |
| 2006/0007690 | A1 | 1/2006 | Cheng |
| 2006/0012299 | A1 | 1/2006 | Suehiro et al. |
| 2006/0023450 | A1 | 2/2006 | Chung et al. |
| 2006/0027786 | A1 | 2/2006 | Dong et al. |
| 2006/0028122 | A1 | 2/2006 | Wang et al. |
| 2006/0028837 | A1 | 2/2006 | Mrakovich |
| 2006/0049416 | A1 | 3/2006 | Baretz et al. |
| 2006/0057753 | A1 | 3/2006 | Schardt et al. |
| 2006/0092644 | A1 | 5/2006 | Mok et al. |
| 2006/0097245 | A1 | 5/2006 | Aanegola et al. |
| 2006/0124947 | A1 | 6/2006 | Mueller et al. |
| 2006/0158090 | A1 | 7/2006 | Wang et al. |
| 2006/0244358 | A1 | 11/2006 | Kim et al. |
| 2006/0261309 | A1 | 11/2006 | Li et al. |
| 2006/0262532 | A1 | 11/2006 | Blumel |
| 2007/0029526 | A1 | 2/2007 | Cheng et al. |
| 2007/0091601 | A1 | 4/2007 | Hsieh et al. |
| 2007/0120135 | A1 | 5/2007 | Soules et al. |
| 2007/0170840 | A1 | 7/2007 | Chang-Hae et al. |
| 2007/0240346 | A1 | 10/2007 | Li et al. |
| 2007/0267976 | A1 | 11/2007 | Bohler et al. |
| 2008/0029720 | A1 | 2/2008 | Li |
| 2008/0048200 | A1 | 2/2008 | Mueller et al. |
| 2008/0062672 | A1 | 3/2008 | Pang et al. |
| 2008/0111472 | A1 | 5/2008 | Liu |
| 2008/0130285 | A1 | 6/2008 | Negley et al. |
| 2008/0218992 | A1 | 9/2008 | Li |
| 2008/0224597 | A1 | 9/2008 | Baretz et al. |
| 2008/0224598 | A1 | 9/2008 | Baretz et al. |
| 2008/0246044 | A1 | 10/2008 | Pang |
| 2008/0308825 | A1 | 12/2008 | Chakraborty et al. |
| 2009/0026908 | A1 | 1/2009 | Bechtel et al. |
| 2009/0050911 | A1 | 2/2009 | Chakraborty |
| 2009/0086492 | A1 | 4/2009 | Meyer |
| 2009/0103293 | A1 | 4/2009 | Harbers et al. |
| 2009/0219713 | A1 | 9/2009 | Siemiet et al. |
| 2009/0267099 | A1 | 10/2009 | Sakai |
| 2009/0272996 | A1 | 11/2009 | Chakraborty |
| 2009/0283721 | A1 | 11/2009 | Liu |
| 2010/0060130 | A1 | 3/2010 | Li |
| 2010/0098126 | A1 | 4/2010 | Singer et al. |
| 2010/0188613 | A1 | 7/2010 | Tsukahara et al. |
| 2010/0195861 | A1 | 8/2010 | King |
| 2010/0220476 | A1 | 9/2010 | Kuo |
| 2010/0295077 | A1 | 11/2010 | Melman |
| 2010/0295442 | A1 | 11/2010 | Harbers et al. |
| 2010/0321921 | A1 | 12/2010 | Ivey |
| 2011/0006316 | A1 | 1/2011 | Wen-Chiun |
| 2011/0103053 | A1 | 5/2011 | Chen et al. |
| 2011/0147778 | A1 | 6/2011 | Ichikawa |
| 2011/0149548 | A1 | 6/2011 | Yang et al. |
| 2011/0222279 | A1 | 9/2011 | Kim et al. |
| 2011/0227102 | A1 | 9/2011 | Hussell et al. |
| 2011/0228517 | A1 | 9/2011 | Kawabat et al. |
| 2011/0280036 | A1 | 11/2011 | Yi |
| 2011/0292652 | A1 | 12/2011 | Huang et al. |
| 2011/0303940 | A1 | 12/2011 | Lee et al. |
| 2011/0305024 | A1 | 12/2011 | Chang |
| 2011/0310587 | A1* | 12/2011 | Edmond .................. G02B 5/02 362/84 |
| 2012/0051058 | A1 | 3/2012 | Sharma et al. |
| 2012/0086034 | A1 | 4/2012 | Yuan |
| 2012/0106144 | A1 | 5/2012 | Chang |
| 2013/0021792 | A1 | 1/2013 | Snell et al. |
| 2013/0208457 | A1 | 8/2013 | Durkee et al. |
| 2013/0271971 | A1 | 10/2013 | Uemura |
| 2014/0226305 | A1 | 8/2014 | Kim et al. |
| 2015/0098228 | A1 | 4/2015 | Simon et al. |
| 2015/0146407 | A1 | 5/2015 | Boonekamp et al. |
| 2016/0109068 | A1 | 4/2016 | Boonekamp et al. |

FOREIGN PATENT DOCUMENTS

| | | | |
|---|---|---|---|
| CN | 101375420 | A | 2/2009 |
| CN | 101421855 | A | 4/2009 |
| CN | 201621505 | U | 11/2010 |
| CN | 201628127 | U | 11/2010 |
| CN | 101925772 | A | 12/2010 |
| CN | 102142510 | A | 8/2011 |
| CN | 102159880 | A | 8/2011 |
| CN | 102171844 | A | 8/2011 |
| EP | 647694 | | 4/1995 |
| EP | 0982924 | A2 | 3/2000 |
| EP | 0982927 | A2 | 3/2000 |
| EP | 2113949 | A2 | 11/2009 |
| GB | 2017409 | | 10/1979 |
| GB | 2366610 | | 3/2002 |
| JP | S50-79379 | | 11/1973 |
| JP | 60170194 | | 9/1985 |
| JP | 862-189770 | | 8/1987 |
| JP | H01-179471 | | 7/1989 |
| JP | 01-260707 | | 10/1989 |
| JP | H02-91980 | | 3/1990 |
| JP | H3-24692 | | 3/1991 |
| JP | 4010665 | | 1/1992 |
| JP | 4010666 | | 1/1992 |
| JP | 04-289691 | | 10/1992 |
| JP | 4-321280 | | 11/1992 |
| JP | 05-152609 | | 6/1993 |
| JP | 6207170 | | 7/1994 |
| JP | 6267301 | | 9/1994 |
| JP | 6283755 | | 10/1994 |
| JP | 07-099345 | | 4/1995 |
| JP | 07094785 | | 4/1995 |
| JP | H07-176794 | | 7/1995 |
| JP | 07-235207 | | 9/1995 |
| JP | H7-282609 | | 10/1995 |
| JP | H08-7614 | | 1/1996 |
| JP | 8250281 | | 9/1996 |
| JP | 2900928 | | 3/1999 |
| JP | H1173922 | | 3/1999 |

(56) References Cited

FOREIGN PATENT DOCUMENTS

| | | | |
|---|---|---|---|
| JP | H11251640 | A | 9/1999 |
| JP | 2000031548 | A | 1/2000 |
| JP | 2001177153 | A | 6/2001 |
| JP | 2002133910 | A | 5/2002 |
| JP | 2003101078 | | 4/2003 |
| JP | P2003-234513 | | 8/2003 |
| JP | 2005011953 | | 1/2005 |
| JP | 2005050775 | A | 2/2005 |
| JP | P3724490 | | 9/2005 |
| JP | P3724498 | | 9/2005 |
| JP | 2005330459 | | 12/2005 |
| JP | 2005332951 | A | 12/2005 |
| JP | 2010129300 | A | 6/2010 |
| JP | 2010199145 | A | 9/2010 |
| JP | 2011129661 | A | 6/2011 |
| JP | 2011192793 | A | 9/2011 |
| JP | 2012253815 | A | 12/2012 |
| KR | 2007-0065486 | A | 6/2007 |
| KR | 2009-0017346 | A | 2/2009 |
| KR | 1020120137719 | A | 12/2012 |
| KR | 201330062875 | A | 6/2013 |
| RU | 214492 | | 6/1998 |
| TW | 200527664 | | 8/2005 |
| TW | 200811273 | A | 3/2008 |
| TW | M392320 | | 11/2010 |
| TW | 201107673 | | 3/2011 |
| TW | I374926 | | 10/2012 |
| TW | M438583 | | 10/2012 |
| TW | M442584 | | 12/2012 |
| WO | WO 9108508 | | 6/1991 |
| WO | WO 2002007228 | | 1/2002 |
| WO | WO 2004021461 | A2 | 3/2004 |
| WO | WO 2004077580 | | 9/2004 |
| WO | WO 2005025831 | | 3/2005 |
| WO | WO 2006022792 | | 3/2006 |
| WO | WO 2007085977 | A1 | 8/2007 |
| WO | WO 2007130357 | A2 | 11/2007 |
| WO | WO 2008019041 | A2 | 2/2008 |
| WO | WO 2008043519 | A1 | 4/2008 |
| WO | WO 2010074963 | A1 | 1/2010 |
| WO | WO 2010038097 | | 4/2010 |
| WO | WO 2010048935 | A1 | 5/2010 |
| WO | WO 2011101764 | A1 | 8/2011 |
| WO | WO 2012047937 | A1 | 4/2012 |

OTHER PUBLICATIONS

Aug. 21, 2006 Office Action in U.S. Appl. No. 10/623,198, issued by Thao X. Le.

Aug. 24, 2007 Office Action in U.S. Appl. No. 11/264,124, issued by Thao X. Le.

Aug. 26, 2010 Office Action in U.S. Appl. No. 12/131,118, issued by Examiner Abul Kalam.

Berggren, M. et al., "Light-emitting diodes with variable colours from polymer blends", "Nature", Dec. 1, 1994, pp. 444-446, vol. 372.

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.

Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.

Bradfield, P.L., et al., "Electroluminescence from sulfur impurities in a p-n junction formed in epitaxial silicon", "Appl. Phys. Lett", 07110/1989, pp.•10D-102, vol. 55, No. 2.

Chao, Zhang Jin, et al., "White light emitting glasses", "Journal of Solid State Chemistry", 1991, pp. 17-29, vol. 93.

Comrie, M. , "Full Color LED Added to Lumex's Lineup", "EBN", Jun. 19, 1995, p. 28.

CRC Handbook, 63rd Ed., (1983) p. E-201.

Das, N. C., et al., "Luminescence spectra of ann-channel metal-oxide-semiconductor field-effect transistor at breakdown", 1990, pp. 1152-1153, vol. 56, No. 12.

Dec. 16. 2004 Office Action in U.S. Appl. No. 10/623,198, issued by Thao X. Le.

Dictionary Definition of Phosphor, Oxford English Dictionary Online, Mar. 9, 2012 (Only partial available due to corrupt file as provided by Examiner, Steven Y. Horikoshi, on Mar. 22, 2012 in U.S. Appl. No. 12/131,119; Request for Full Reference filed).

El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. 12/131,118, issued by Abul Kalam.

Feb. 26, 2008 Office Action in U.S. Appl. No. 11/264,124, issued by Abu I Kalam.

Feb. 4, 2005 Office Action in U.S. Appl. No. 10/623,198, issued by Thao X. Le.

Feb. 7, 2007 Office Action in U.S. Appl. No. 11/264,124, issued by Thao X. Le.

Forrest, S. et al. , "Organic emitters promise a new generation of displays", "Laser Focus World ", Feb. 1995, pp. 99-107.

Hamada, Y. et al. , "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Hamakawa, Yoshihiro, et al., "Toward a visible light display by amorphous SiC:H alloy system", "Optoelectronics—Devices and Technologies", Dec. 1989, pp. 281-294, vol. 4, No. 2.

Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.

Jang, S., "Effect of Avalanche-Induced Light Emission on the Multiplication Factor in Bipolar Junction Transistors", "Solid-State Electronics", 1991, pp. 1191-1196, vol. 34, No. 11.

Jan. 29, 2007 Office Action in U.S. Appl. No. 10/623,198, issued by Thao X. Le.

Jan. 30, 2006 Office Action in U.S. Appl. No. 11/264,124, issued by Thao X. Le.

Jan. 7, 2011 Office Action in U.S. Appl. No. 12/131,119, issued by Steven Y. Horikoshi.

Jul. 10, 2008 Office Action in U.S. Appl. No. 11/264,124, issued by Abu I Kalam.

Jul. 14, 2005 Notice of Allowance, Notice of Allowability, and Examiner's Statement of Reasons for Allowance in U.S. Appl. No. 10/623,198, issued by Thao X. Le.

Jul. 14, 2011 Office Action in U.S. Appl. No. 12/131,119, issued by Steve Horikoshi.

Jul. 7, 2011 Office Action in U.S. Appl. No. 12/131,118, issued by Abu I Kalam.

Jun. 14, 2006 Office Action in U.S. Appl. No. 11/264,124, issued by Thao X. Le.

Jun. 26, 2007 Office Action in U.S. Appl. No. 10/623,198, issued by Thao X. Le.

Kido, J. et al. , "1,2,4-Triazole Derivative as an Electron Transport Layer in Organic Luminescent Devices", "Jpn. J. Appl. Phys. ", Jul. 1, 1993, pp. L917-L920, vol. 32.

Kido, J. et al. , "Bright blue electroluminescence from poly(N-vinylcarbazole)", "Appl. Phys. Letters", Nov. 8, 1993, pp. 2627-2629, vol. 63, No. 19.

Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.

Krames, M., et al., "Status and Future of High-Power Light-Emitting Diodes for Solid-Slate Lighting", "Journal of Display Technology", Jun. 2007, pp. 160-175, vol. 3, No. 2.

Kudryashov, V., et al., "Spectra of Superbright Blue and Green InGaN/AIGaN/GaN Light-Emitting diodes", "Journal of the European Ceramic Society", May 1996, pp. 2033-2037, vol. 17.

Larach, S., et al., "Blue emitting luminescent phosphors: Review and status", "Int'l Workshop on Electroluminescence", 1990, pp. 137-143.

(56) References Cited

OTHER PUBLICATIONS

LEDs and Laser Diodes, Electus Distribution, copyright 2001, available at URL:http://www.jaycar.com.au/images_uploaded/ledlaser.Pdf.
Lester, S., et al., "High dislocation densities in high efficiency GaN-based light-emitting diodes", "Appl. Phys. Lett.", Mar. 6, 1995, pp. 1249-1251, vol. 66, No. 10.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/Basf/Prd/30048274/ .pdt?title=Technicai%20Datasheet&asset_type=pds/pdf&language=EN&urn=urn:documentum:eCommerce_soi_EU :09007bb280021e27.pdf:09007bb280021e27.pdf.
Mar. 2, 2009 Office Action in U.S. Appl. No. 10/623,198, issued by Abu I Kalam.
Mar. 22, 2012 Office Action in U.S. Appl. No. 12/131,119, issued by Steven Y. Horikoshi.
Mar. 28, 2006 Office Action in U.S. Appl. No. 10/623,198, issued by Thao X. Le.
Mar. 4, 2011 Notice of Allowance, Notice of Allowability, Examiners Interview Summary, Examiners Amendment/Comment and Examiners Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119, issued by Examiner Steven Horikoshi.
McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.
Mimura, Hidenori, et al., "Visible electroluminescence from uc-SiC/porous Si/c-Si p-n junctions", "Int. , J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30. 2010 Office Action in U.S. Appl. No. 12/131,118. issued by Examiner Abu I Kalam.
Oct. 20, 2008 Office Action in U.S. Appl. No. 10/623,198, issued by Abu I Kalam.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . .", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn A Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.
Sep. 29, 2009 Office Action in U.S. Appl. No. 11/264,124, issued by Abu I Kalam.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M. , "Recent trends of development of silicon monocarbide blue-light emission diodes", "Kinzoku ", 1989, pp. 11-15, vol. 59, No. 9.
Werner, K. , "Higher Visibility for LEDs", "IEEE Spectrum", Jul. 1994, pp. 30-39.
Wojciechowski, J. et al. , "Infrared-To-Blue Up-Converting Phosphor", "Electron Technology", 1978, pp. 31-47, vol. 11, No. 3.
Yamaguchi, Y. et al., "High-Brightness SiC Blue LEDS and Their Application to Full Color LED Lamps", "Optoelectronics-Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics-Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol. ", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
Notice of Decision of Rejection dated Oct. 29, 2014 for Korean Appln. No. 10-2009-7004371.
Final Office Action dated Oct. 30, 2013 for U.S. Appl. No. 13/087,615.
Non-Final Office Action dated Nov. 8, 2013 for U.S. Appl. No. 13/436,507.

(56) References Cited

OTHER PUBLICATIONS

Non-Final Office Action dated Nov. 12, 2013 for U.S. Appl. No. ITMX-00116US5.
Final Office Action dated Jan. 30, 2014 for U.S. Appl. No. 13/436,471.
Foreign Office Action dated Dec. 20, 2013 for Korean Appln. No. 10-2009-7004371.
Non-Final Office Action dated Feb. 11, 2014 for U.S. Appl. No. 13/087,615.
Foreign Office Action dated Feb. 12, 2014 for Chinese Patent Application No. 200780032995.
Final Office Action dated Feb. 21, 2014 for U.S. Appl. No. 13/441,714.
Final Office Action dated Feb. 24, 2014 for U.S. Appl. No. 12/624,900.
International Preliminary Report on Patentability dated Apr. 24, 2014 for PCT Appln. No. PCT/US2012/059892.
Foreign Office Action dated May 15, 2014 for European Appln. No. 07811039.2.
Office Action dated May 20, 2014 for JP Patent Appln. No. 2013-154964.
Non-Final Office Action dated May 29, 2014 for U.S. Appl. No. 13/436,471.
Final Office Action dated Jun. 12, 2014 for U.S. Appl. No. 13/436,329.
Final Office Action dated Jun. 12, 2014 for U.S. Appl. No. 13/436,507.
Foreign Office Action dated Jun. 13, 2014 for Chinese Appln. No. 200780032995.8.
Non-Final Office Action dated Jun. 23, 2014 for U.S. Appl. No. 13/441,714.
Non-Final Office Action dated Jun. 27, 2014 for U.S. Appl. No. 12/624,900.
Final Office Action dated Jul. 17, 2014 for U.S. Appl. No. 13/087,615.
Office Action dated Sep. 23, 2014 for Chinese Appln. No. 201180048303.5.
Final Office Action dated Oct. 24, 2014 for U.S. Appl. No. 12/624,900.
Foreign Office Action dated Nov. 3, 2014 for Chinese Appln. No. 200780032995.8.
Non-Final Office Action dated Nov. 3, 2014 for U.S. Appln. No. ITMX-00116US5.
Final Office Action dated Nov. 4, 2014 for U.S. Appl. No. 13/436,471.
Revised Final Office Action dated Nov. 13, 2014 for U.S. Appl. No. 13/436,507.
Foreign Office Action dated Dec. 16, 2014 for Japanese Appln. No. 2013-532890.
Non-Final Office Action dated Dec. 3, 2015 for U.S. Appl. No. 14/213,096.
Notice of Allowance dated Jul. 27, 2016 for U.S. Appl. No. 14/213,096.
Non-Final Office Action dated Aug. 12, 2016 for U.S. Appl. No. 14/641,237.
Non-Final Office Action dated Apr. 2, 2015 for U.S. Appl. No. 14/213,005.
Final Office Action dated Jan. 6, 2016 for U.S. Appl. No. 14/213,005.
Final Office Action dated Jan. 21, 2016 for U.S. Appl. No. 14/136,972.
Non-Final Office Action dated Apr. 21, 2015 for U.S. Appl. No. 14/136,972.
Non-Final Office Action dated Jul. 22, 2016 for U.S. Appl. No. 14/136,972.
Non-Final Office Action dated Jun. 19, 2014 for U.S. Appl. No. 14/101,247.
Non-Final Office Action dated Jan. 22, 2016 for U.S. Appl. No. 14/624,493.
Non-Final Office Action dated Nov. 10, 2014 for U.S. Appl. No. 14/108,163.
Final Office Action dated Feb. 26, 2015 for U.S. Appl. No. 14/108,163.
Foreign Office Action dated Dec. 15, 2014 for Taiwanese Appln. No. 100136131.
Notice of Allowance dated Jan. 22, 2015 for U.S. Appl. No. 13/441,714.
International Preliminary Report on Patentability dated Jan. 8, 2015 for PCT Appln. No. PCT/US13/48354.
Foreign Office Action dated Mar. 31, 2015 or JP Patent Appln. No. 2013-154964.
Non-Final Office Action dated May 22, 2015 for U.S. Appl. No. 13/436,507.
Foreign Office Action dated Jun. 3, 2015 for CN Appln. No. 201280057372.7.
Office Action dated Jul. 8, 2015 for Chinese Appln. No. 201180048303.5.
Non-Final Office Action dated May 8, 2015 for U.S. Appl. No. 14/607,032.
Non-Final Office Action dated Mar. 3, 2016 for U.S. Appl. No. 14/607,032.
PCT International Search Report and Written Opinion dated Apr. 7, 2014, Appln No. PCT/US2013/077462, Forms (PCT/ISA/220, PCT/ISA/210, and PCT/ISA/237).
PCT International Search Report dated Apr. 7, 2014 in International Application No. PCT/US2013/07762, Form ISA 220 and 210.
PCT Written Opinion dated Apr. 7, 2014 in International Application No. PCT/US2013/07762, Form ISA 237.
Foreign Office Action dated May 11, 2015 for TW Appln. No. 102100038, 6 pages.
International Search Report and Written Opinion dated Jul. 10, 2014 in International Application No. PCT/US2014/025314 (10 pages).
Foreign Office Action dated Sep. 23, 2014 for Chinese Appln. No. 201180048303.5.
Extended Search Report dated Sep. 11, 2015 for EP Appln. No. 12839621.5.
Foreign Office Action dated Dec. 10, 2015 for Chinese Appln. No. 201180048303.5.
Non-Final Office Action dated Jan. 20, 2016 for U.S. Appl. No. 14/157,501.
Foreign Office Action dated Jan. 27, 2016 for Chinese Patent Application No. 201380032879.1.
Foreign Office Action dated Feb. 1, 2016 for CN Appln. No. 201280057372.7.
Foreign Office Action dated Jun. 28, 2016 for Japanese Appln. No. 2014-535097.
Final Office Action dated Jul. 1, 2016 for U.S. Appl. No. 14/157,501.
Supplemental Search Report dated Sep. 16, 2016 for EP Appln. No. 13868577.1.
Foreign Office Action dated Jul. 28, 2016 for CN Appln. No. 201480021701.1.
International Preliminary Report on Patentability dated Sep. 22, 2016 for PCT Appln. No. PCT/US2015/019235.
Final Office Action dated Mar. 20, 2017 for U.S. Appl. No. 14/641,237.
Final Office Action dated May 16, 2017 for U.S. Appl. No. 14/136,972.
Notice of Allowance dated Aug. 1, 2016 for U.S. Appl. No. 14/213,005.
Foreign Office Action dated Jul. 12, 2017 for Taiwanese Appln. No. 101137205.
Foreign Office Action dated May 19, 2017 for Taiwanese Appln. No. 102148527.
Foreign Office Action dated Jan. 29, 2019 for Taiwanese Appln. No. 102148527.
Foreign Office Action dated Nov. 13, 2018 for Chinese Appln. No. 201380072490.
Foreign Office Action dated Dec. 27, 2017 for Chinese Appln. No. 201380072490.

* cited by examiner

SOLID-STATE LAMPS UTILIZING PHOTOLUMINESCENCE WAVELENGTH CONVERSION COMPONENTS

CROSS-REFERENCE TO RELATED APPLICATION(S)

This application is a continuation of U.S. application Ser. No. 14/136,972, filed on Dec. 20, 2013, which claims the benefit of U.S. Provisional App. Ser. No. 61/746,986, filed on Dec. 28, 2013, which are hereby expressly incorporated by reference in their entirety.

FIELD

This invention relates to solid-state lamps that utilize photoluminescence wavelength conversion components. In particular, although not exclusively, embodiments concern photoluminescence wavelength conversion components for solid-state lamps (bulbs) with an omnidirectional emission pattern. Moreover, the invention provides methods of manufacturing photoluminescence wavelength conversion components.

BACKGROUND

White light generating LEDs, "white LEDs", are a relatively recent innovation and offer the potential for a whole new generation of energy efficient lighting systems to come into existence. It is predicted that white LEDs could replace filament (incandescent), fluorescent and compact fluorescent light sources due to their long operating lifetimes, potentially many 100,000 of hours, and their high efficiency in terms of low power consumption. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photoluminescence materials, which absorb a portion of the radiation emitted by the LED and re-emit radiation of a different color (wavelength). Typically, the LED die generates blue light and the phosphor(s) absorbs a percentage of the blue light and emits yellow light or a combination of green and red light, green and yellow light or yellow and red light. The portion of the blue light generated by the LED that is not absorbed by the phosphor is combined with the light emitted by the phosphor to provide light which appears to the human eye as being nearly white in color.

Due to their long operating life expectancy (>50,000 hours) and high luminous efficacy (70 lumens per watt and higher) high brightness white LEDs are increasingly being used to replace conventional fluorescent, compact fluorescent and incandescent light sources.

Typically in white LEDs the phosphor material is mixed with a light transmissive material such as a silicone or epoxy material and the mixture applied to the light emitting surface of the LED die. It is also known to provide the phosphor material as a layer on, or incorporate the phosphor material within, an optical component (a photoluminescence wavelength conversion component) that is located remote to the LED die (typically physically spatially separated from the LED die). Such arrangements are termed "remote phosphor" arrangements. Advantages of a remotely located phosphor wavelength conversion component are a reduced likelihood of thermal degradation of the phosphor materials and a more consistent color of generated light.

Traditional incandescent light bulbs are inefficient and have life time issues. LED-based technology is moving to replace traditional bulbs and even CFL (Compact Fluorescent Lamp) with a more efficient and longer life lighting solution. However the known LED-based lamps have difficulty matching the omnidirectional (evenly in all directions) emission characteristics of an incandescent bulb due to the intrinsically highly directional light emission characteristics of LEDs.

FIG. 1 shows a schematic partial sectional view of a known LED-based lamp (light bulb) 10 that utilizes a photoluminescence wavelength conversion component. The lamp 10 comprises a generally conical shaped thermally conductive body 12 and connector cap 14 mounted to the truncated apex of the body 12. The body 12 further comprises a conical shaped pedestal 16 extending from the base of the body 12 and one or more blue light emitting LEDs 18 mounted in thermal communication with the truncated apex of the pedestal 16. In order to generate white light the lamp 10 further comprises a photoluminescence wavelength conversion component 20 mounted to the pedestal and configured to enclose the LED(s) 18. As indicated in FIG. 1 the wavelength conversion component 20 comprises a spherical hollow shell and includes one or more phosphor materials to provide photoluminescence wavelength conversion of blue light generated by the LED(s). To give a diffuse light emission, and for aesthetic considerations, the lamp 10 further comprise a light transmissive envelope 22 which encloses the wavelength conversion component 20.

Whilst the lamp 10 of FIG. 1 has an improved emission characteristic, the emission characteristic of such a lamp fails to meet required industry standards since it emits too much light on axis 24. A further problem with such lamps is the relatively high manufacturing cost of the photoluminescence wavelength conversion component which is typically manufactured by injection molding. The high cost of manufacture results from the opening of the component being smaller than the maximum internal size of the component requiring use of a collapsible former to enable removal of the component from the injection molder. Embodiments of the invention at least in-part address the limitation of the known LED-based lamps.

SUMMARY

Embodiments of the invention concern improved photoluminescence wavelength conversion components and lamps that incorporate such components. The improved lamps and wavelength conversion components of the embodiments of the invention provide for improved emission characteristic, while allowing for relatively cost-effective manufacturing costs.

According to some embodiments, the photoluminescence wavelength conversion component comprises a hollow cylindrical tube having a bore of diameter Ø and an axial length L. In one exemplary embodiment, the length of the component is approximately four times the bore diameter of the component and the aspect ratio of the component in an axial direction (ratio of length to bore diameter) is approximately 4:1. The relative dimensions and shape of the component can affect the radial emission pattern of the component and are configured to give a required emission pattern (typically omnidirectional). For an A-19 bulb the bore Ø of the component is between about 1 mm and 10 mm. The photoluminescence material can be homogeneously distributed throughout the volume of the component during manufacture of the component. The wall thickness of the photoluminescence material is typically between 200 μm and 2 mm.

Since the component has a constant cross section it can be readily manufactured using an extrusion method. The component can be formed using a light transmissive thermoplastics (thermosoftening) material such as polycarbonate, acrylic or a low temperature glass using a hot extrusion process. Alternatively the component can comprise a thermosetting or UV curable material such as a silicone or epoxy material and be formed using a cold extrusion method. A benefit of extrusion is that it is relatively inexpensive method of manufacture.

In an alternate embodiment, the component can be formed by injection molding. Since the component has a constant cross section it can be formed using injection molding without the need to use an expensive collapsible former. In other embodiments the component can be formed by casting.

Another possible approach is to manufacture the component is by forming a flexible sheet material to include the phosphor and/or quantum dots, and then rolling the sheet material into the desired shape and dimensions for the component. The phosphor may be applied as a layer onto the sheet material, e.g., by coating, printing, or other suitable deposition methods. Alternatively, the phosphor may be incorporated within the material of the flexible sheet.

One benefit of photoluminescence components in accordance with embodiments of the invention is that as well as improving the emission distribution pattern, they can also improve overall light emission efficiency. The hollow tubular wavelength conversion components described can gives a total light emission that is greater than the known wavelength conversion components. The increase in emission efficiency can result from the component having a high aspect ratio which reduces the possibility of re-absorption of light by the LED(s) positioned at the opening of the component.

A further advantage of photoluminescence wavelength conversion components in accordance with the invention is that their light emission resembles a filament of a conventional incandescent light bulb.

In some embodiments, the photoluminescence materials comprise phosphors. However, the invention is applicable to any type of photoluminescence material, such as either phosphor materials, quantum dots or combinations thereof.

In one embodiment, a lamp comprises a generally conical shaped thermally conductive body, where the outer surface of the body generally resembles a frustum of a cone. If the lamp is intended to replace a conventional incandescent A-19 light bulb, the dimensions of the lamp are selected to ensure that the device will fit a conventional lighting fixture. One or more solid-state light emitters are provided within the lamp, e.g., using a gallium nitride-based blue light emitting LED operable to generate blue light with a dominant wavelength of 455 nm-465 nm. The solid-state light emitters can be configured such that their principle emission axis is parallel with the axis of the lamp. The lamp further comprises a photoluminescence wavelength conversion component that includes one or more photoluminescence materials. The photoluminescence wavelength conversion component comprises an elongate component having a constant cross section and a reflector on the end of the component distal to the LEDs. The reflector operates to reduce or eliminate light emission from the end of the component. By reducing or eliminating light emission from the end of the component reduces the overall emission intensity along the axis of the lamp.

An alternate embodiment comprises an LED candle bulb utilizing a photoluminescence wavelength conversion component in accordance the invention. In this embodiment the photoluminescence wavelength conversion component comprises an elongate tubular component with the photoluminescence material incorporated into the material comprising the component and homogeneously distributed throughout its volume.

Another embodiment is directed to a photoluminescence wavelength conversion component which comprises a tubular component in which the photoluminescence material is incorporated into the material comprising the component, and where the component is mounted to a hollow light transmissive tube and has a length such that it covers only the end portion of the tube distal to the LED(s). In some embodiments, the component can comprise a semi-flexible material and the component is slipped over the tube. In certain designs, the portion of the tube that is not covered with phosphor (i.e. the portion of the tube proximal to the LED(s)) can include a light reflective surface to prevent light emission from this portion of the tube.

In another embodiment, a plurality of openings at, within, and/or communicating with the interior of the lamp is provided to enable airflow through the lamp. In one approach, one or more passages within the lamp are in fluid communication with a plurality of openings between the fins on the lamp body. In operation, heat generated by the LEDs heats air within the passage which through a process of convection causes air to be drawn into and pass through the bulb thereby providing passive cooling of the LEDs.

While certain embodiments pertain to photoluminescence components that comprise a hollow component (i.e. the central region or bore does not include a light transmissive medium), in other embodiments the component can comprise a component having a solid light transmissive core. A component with a light transmissive core can further increase light emission by eliminating or significantly any air interface between the wavelength conversion component and the LEDs. This is particularly so for light travelling in a radial direction between walls of the component.

One embodiment of the invention pertains to a photoluminescence wavelength conversion component that comprises a solid cylindrical shaped component composed of a cylindrical light transmissive core and an outer coaxial phosphor layer. Such a component can be formed by co-extrusion of the core and phosphor layers. Alternatively the component can be manufactured by fabricating the component and then inserting a light transmissive cylindrical rod, such as a glass rod, into the bore of the component. In other embodiments the component can be fabricated by coating the phosphor material onto the outer surface of a light transmissive rod such as a glass or polycarbonate rod. In some embodiments the component is fabricated from a resiliently deformable (semi-flexible) light transmissive material such as a silicone material. A benefit of using a resiliently deformable material is that this can assist in insertion of the rod.

Where the photoluminescence wavelength conversion component comprises a solid component, the reflector can comprise a coating, such as a light reflective paint or metallization layer, that is applied directly to the end face of the component.

In an alternate embodiment, the photoluminescence wavelength conversion component comprises a cylindrical light transmissive component with latitudinally extending phosphor regions (strips), e.g., where there are four phosphor regions that are equally circumferentially spaced, although it will be appreciated that the number, shape and configuration of the phosphor regions can be varied within the scope of the invention.

Whilst the invention finds particular application to light bulbs, photoluminescence wavelength conversion components of the invention can be utilized in other light emitting devices and lighting arrangements. Embodiments of the invention can be applied to manufacture an LED reflector lamp, such as an MR16 lamp. In this embodiment the photoluminescence wavelength conversion component comprises has either a hollow or a solid core with a phosphor layer covering an end portion distal to the LED(s). Optionally, the portion of the core that is not covered with phosphor (i.e. the portion of the tube proximal to the LED(s)) can include a light reflective surface to prevent light emission from this portion of the core.

Embodiments may also be applied to the manufacture of an LED downlight that utilizes multiple photoluminescence wavelength conversion components in accordance with the invention. In this embodiment, some or all of the photoluminescence wavelength conversion components comprise an elongate hollow (or solid) tubular component with the photoluminescence material incorporated into the material comprising the component and homogeneously distributed throughout its volume.

The photoluminescence wavelength conversion component in some embodiments comprises a first proximal end for receiving light and a reflector on the distal end. In alternate embodiments, the photoluminescence wavelength conversion component is configured such that each end of the component is configured to receive light thereby eliminating the need for the reflector.

In some embodiments, the component is configured to have LEDs located at both ends. In this embodiment the photoluminescence wavelength conversion component comprises an elongate hollow (or solid) tubular component with the photoluminescence material incorporated into the material comprising the component and homogeneously distributed throughout its volume. A first LED(s) are located at a first end of the component and a second LED(s) at the opposite end of the component. In an alternate embodiment, the component comprises a tubular component whose ends are looped around such that both ends share a common plane.

Yet another embodiment is directed to an LED linear lamp utilizing multiple photoluminescence wavelength conversion components. In this embodiment each photoluminescence wavelength conversion component comprises an elongate tubular component with the photoluminescence material incorporated into the material comprising the component and homogeneously distributed throughout its volume.

Further details of aspects, objects, and advantages of the invention are described below in the detailed description, drawings and claims. Both the foregoing general description and the following detailed description are exemplary and explanatory, and are not intended to be limiting as to the scope of the invention.

BRIEF DESCRIPTION OF THE DRAWINGS

In order that the present invention is better understood, LED lamps and photoluminescence components in accordance with embodiments of the invention will now be described, by way of example only, with reference to the accompanying drawings in which.

DETAILED DESCRIPTION

Figure 1:
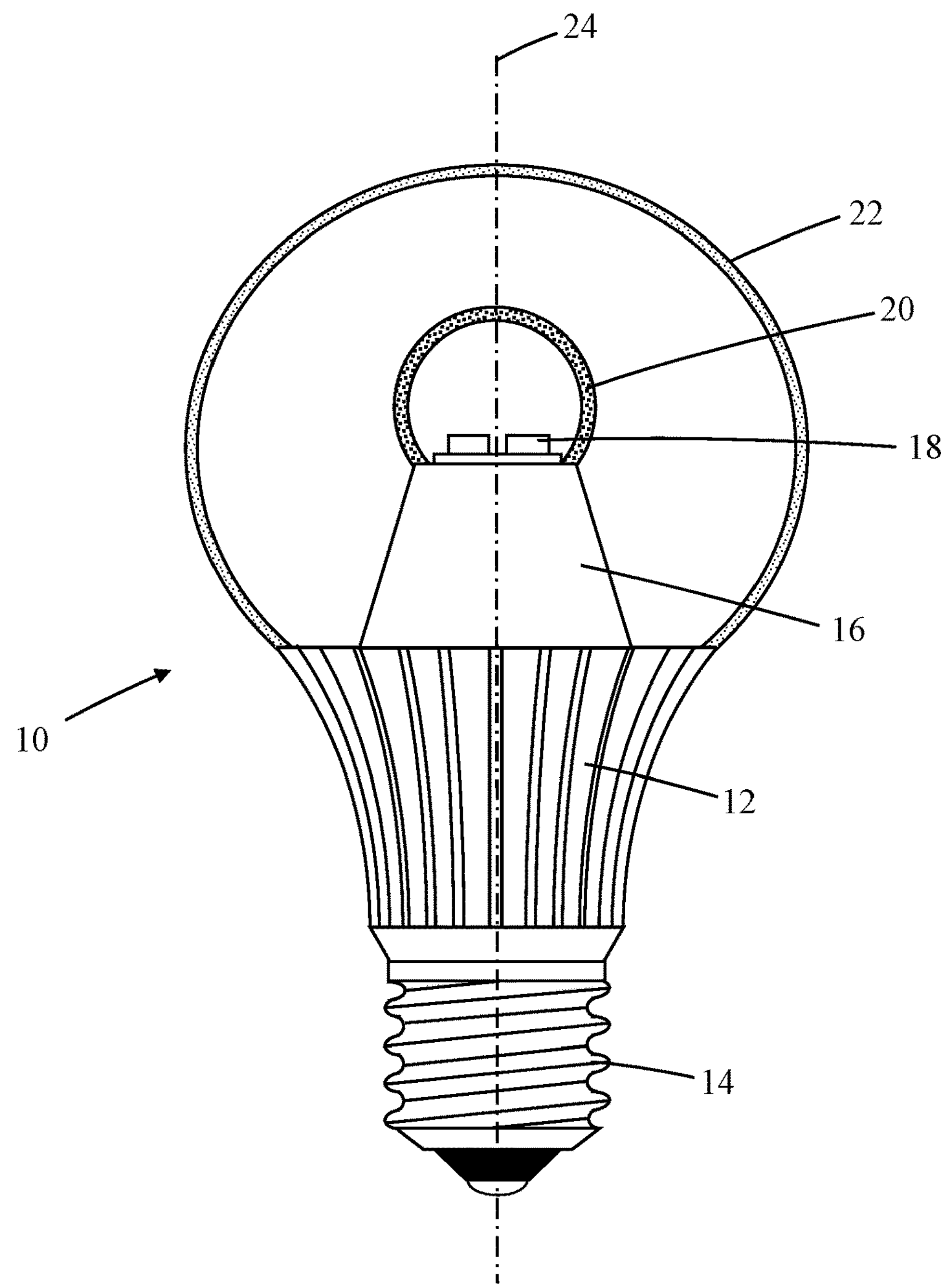
FIG. 1 is a schematic partial sectional view of a known LED bulb as previously described.

Lamps (light bulbs) are available in a number of forms, and are often standardly referenced by a combination of letters and numbers. The letter designation of a lamp typically refers to the particular shape of type of that lamp, such as General Service (A, mushroom), High Wattage General Service (PS—pear shaped), Decorative (B—candle, CA— twisted candle, BA—bent-tip candle, F—flame, P—fancy round, G—globe), Reflector (R), Parabolic aluminized reflector (PAR) and Multifaceted reflector (MR). The number designation refers to the size of a lamp, often by indicating the diameter of a lamp in units of eighths of an inch. Thus, an A-19 type lamp refers to a general service lamp (bulb) whose shape is referred to by the letter "A" and has a maximum diameter two and three eights of an inch. As of the time of filing of this patent document, the most commonly used household "light bulb" is the lamp having the A-19 envelope, which in the United States is commonly sold with an E26 screw base.

There are various standardization and regulatory bodies that provide exact specifications to define criteria under which a manufacturer is entitled to label a lighting product using these standard reference designations. With regard to the physical dimensions of the lamp, ANSI provides the specifications (ANSI C78.20-2003) that outline the required sizing and shape by which compliance will entitle the manufacture to permissibly label the lamp as an A-19 type lamp. Besides the physical dimensions of the lamp, there may also be additional specifications and standards that refer to performance and functionality of the lamp. For example in the United States the US Environmental Protection Agency (EPA) in conjunction with the US Department of Energy (DOE) promulgates performance specifications under which a lamp may be designated as an "ENERGY STAR" compliant product, e.g. identifying the power usage requirements, minimum light output requirements, luminous intensity distribution requirements, luminous efficacy requirements and life expectancy.

The problem is that the disparate requirements of the different specifications and standards create design constraints that are often in tension with one another. For example, the A-19 lamp is associated with very specific physical sizing and dimension requirements, which is needed to make sure A-19 type lamps sold in the marketplace will fit into common household lighting fixtures. However, for an LED-based replacement lamp to be qualified as an A-19 replacement by ENERGY STAR, it must demonstrate certain performance-related criteria that are difficult to achieve with a solid-state lighting product when limited to the form factor and size of the A-19 light lamp.

For example, with regard to the luminous intensity distribution criteria in the ENERGY STAR specifications, for an LED-based replacement lamp to be qualified as an A-19 replacement by ENERGY STAR it must demonstrate an even (+/−20%) luminous emitted intensity over 270° with a minimum of 5% of the total light emission above 270°. The issue is that LED replacement lamps need electronic drive circuitry and an adequate heat sink area; in order to fit these components into an A-19 form factor, the bottom portion of the lamp (envelope) is replaced by a thermally conductive housing that acts as a heat sink and houses the driver circuitry needed to convert AC power to low voltage DC power used by the LEDs. A problem created by the housing of an LED lamp is that it blocks light emission in directions towards the base as is required to be ENERGY STAR compliant. As a result many LED lamps lose the lower light emitting area of traditional bulbs and become directional light sources, emitting most of the light out of the top dome (180° pattern) and virtually no light downward since it is blocked by the heat sink (body), which frustrates the ability of the lamp to comply with the luminous intensity distribution criteria in the ENERGY STAR specification.

Currently LED replacement lamps are considered too expensive for the general consumer market. Typically an A-19, 60 W replacement LED lamp costs many times the cost of an incandescent bulb or compact fluorescent lamp. The high cost is due to the complex and expensive construction and components used in these lamps.

An LED-based lamp 100 in accordance with embodiments of the invention is now described with reference to FIG. 2 which shows a schematic partial sectional view of the lamp. In some embodiments, the lamp 100 is configured for operation with a 110V (r.m.s.) AC (60 Hz) mains power supply as is found in North America and is intended for use as an ENERGY STAR compliant replacement for an A-19 incandescent light bulb.

The lamp 100 comprises a generally conical shaped thermally conductive body 110. The outer surface of the body 110 generally resembles a frustum of a cone; that is, a cone whose apex (vertex) is truncated by a plane that is parallel to the base (i.e. substantially frustoconical). The body 110 is made of a material with a high thermal conductivity (typically ≥150 $Wm^{-1}K^{-1}$, preferably ≥200 $Wm^{-1}K^{-1}$) such as for example aluminum (250 $Wm^{-1}K^{-1}$), an alloy of aluminum, a magnesium alloy, a metal loaded plastics material such as a polymer, for example an epoxy. Conveniently the body 110 can be die cast when it comprises a metal alloy or molded, by for example injection molding, when it comprises a metal loaded polymer.

A plurality of latitudinal radially extending heat radiating fins (veins) 120 is circumferentially spaced around the outer curved surface of the body 110. Since the lamp is intended to replace a conventional incandescent A-19 light bulb the dimensions of the lamp are selected to ensure that the device will fit a conventional lighting fixture. The body 110 further comprises a conical shaped pedestal portion 130 extending from the base of the body 110. The body 110 can further comprise a coaxial cylindrical cavity (not shown) that extends into the body from the truncated apex the body for housing rectifier or other driver circuitry for operating the lamp.

The lamp 100 further comprises an E26 connector cap (Edison screw lamp base) 140 enabling the lamp to be directly connected to a mains power supply using a standard electrical lighting screw socket. It will be appreciated that depending on the intended application other connector caps can be used such as, for example, a double contact bayonet connector (i.e. B22d or BC) as is commonly used in the United Kingdom, Ireland, Australia, New Zealand and various parts of the British Commonwealth or an E27 screw base (Edison screw lamp base) as used in Europe. The connector cap 140 is mounted to the truncated apex of the body 110.

One or more solid-state light emitter 150 is/are mounted on a circular substrate 160. In some embodiments, the substrate 160 comprises a circular MCPCB (Metal Core Printed Circuit Board). As is known a MCPCB comprises a layered structure composed of a metal core base, typically aluminum, a thermally conducting/electrically insulating dielectric layer and a copper circuit layer for electrically connecting electrical components in a desired circuit configuration. The metal core base of the MCPCB 160 is mounted in thermal communication with the upper surface of the conical pedestal 130 with the aid of a thermally conducting compound such as for example a material containing a standard heat sink compound containing beryllium oxide or aluminum nitride.

Figure 3:
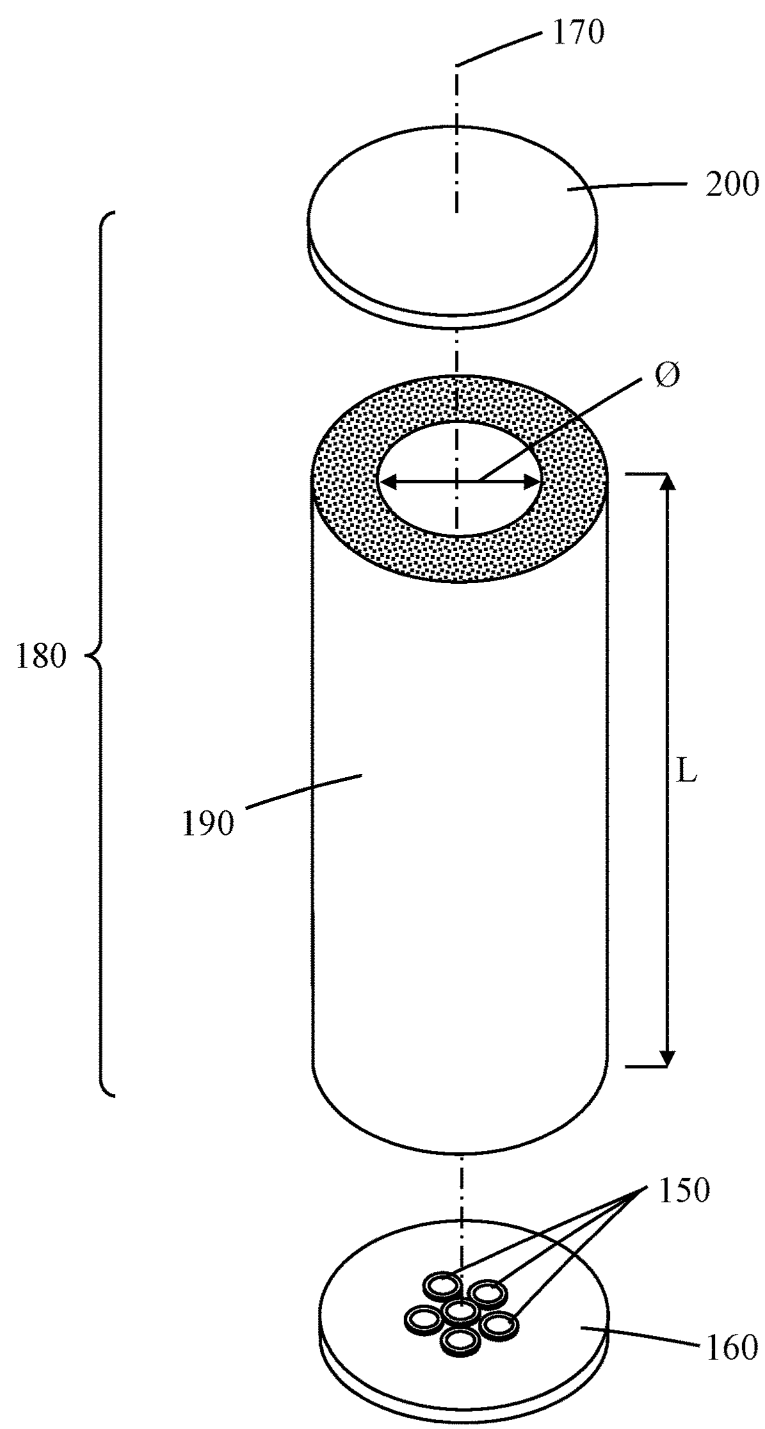
FIG. 3 is an schematic exploded perspective view of the hollow photoluminescence wavelength conversion component of FIG. 2.

Each solid-state light emitter 150 can comprise a gallium nitride-based blue light emitting LED operable to generate blue light with a dominant wavelength of 455 nm-465 nm. As indicated in FIG. 3 the LEDs 150 can be configured as a circular array and oriented such that their principle emission axis is parallel with the axis 170 of the lamp with light being emitted in a direction away from the connector cap 140. A light reflective mask can be provided overlaying the MCPCB that includes apertures corresponding to each LED to maximize light emission from the lamp.

The lamp 100 further comprises a photoluminescence wavelength conversion component 180 that includes one or more photoluminescence materials. The photoluminescence wavelength conversion component 180 comprises an elongate component 190 having a constant cross section and a reflector 200 on the end of the component 190 distal to the LEDs 150. The reflector 200 has a shape that corresponds to the outer shape of the component 190, that is circular in this example, thereby reducing or eliminating light emission from the end of the component. By reducing or eliminating light emission from the end of the component reduces the overall emission intensity along the axis 170 of the lamp.

In some embodiments, the photoluminescence materials comprise phosphors. For the purposes of illustration only, the following description is made with reference to photoluminescence materials embodied specifically as phosphor materials. However, the invention is applicable to any type of photoluminescence material, such as either phosphor materials or quantum dots. A quantum dot is a portion of matter (e.g. semiconductor) whose excitons are confined in all three spatial dimensions that may be excited by radiation energy to emit light of a particular wavelength or range of wavelengths.

The one or more phosphor materials can include an inorganic or organic phosphor such as for example silicate-based phosphor of a general composition $A_3Si(O,D)_5$ or $A_2Si(O,D)_4$ in which Si is silicon, O is oxygen, A includes strontium (Sr), barium (Ba), magnesium (Mg) or calcium (Ca) and D includes chlorine (Cl), fluorine (F), nitrogen (N) or sulfur (S). Examples of silicate-based phosphors are disclosed in U.S. Pat. No. 7,575,697 B2 "Silicate-based green phosphors", U.S. Pat. No. 7,601,276 B2 "Two phase silicate-based yellow phosphors", U.S. Pat. No. 7,655,156 B2 "Silicate-based orange phosphors" and U.S. Pat. No. 7,311,858 B2 "Silicate-based yellow green phosphors". The phosphor can also include an aluminate-based material such as is taught in co-pending patent application US2006/0158090 A1 "Novel aluminate-based green phosphors" and U.S. Pat. No. 7,390,437 B2 "Aluminate-based blue phosphors", an aluminum-silicate phosphor as taught in co-pending application US2008/0111472 A1 "Aluminum-silicate orange-red phosphor" or a nitride-based red phosphor material such as is taught in co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can include any phosphor material including nitride and/or sulfate phosphor materials, oxy-nitrides and oxy-sulfate phosphors or garnet materials (YAG).

Quantum dots can comprise different materials, for example cadmium selenide (CdSe). The color of light generated by a quantum dot is enabled by the quantum confinement effect associated with the nano-crystal structure of the quantum dots. The energy level of each quantum dot relates directly to the size of the quantum dot. For example, the larger quantum dots, such as red quantum dots, can absorb and emit photons having a relatively lower energy (i.e. a relatively longer wavelength). On the other hand, orange quantum dots, which are smaller in size can absorb and emit photons of a relatively higher energy (shorter wavelength). Additionally, daylight panels are envisioned that use cadmium free quantum dots and rare earth (RE) doped oxide colloidal phosphor nano-particles, in order to avoid the toxicity of the cadmium in the quantum dots.

Examples of suitable quantum dots include: CdZnSeS (cadmium zinc selenium sulfide), $Cd_xZn_{1-x}Se$ (cadmium zinc selenide), $CdSe_xS_{1-x}$ (cadmim selenium sulfide), CdTe (cadmium telluride), $CdTe_xS_{1-x}$ (cadmium tellurium sulfide), InP (indium phosphide), $In_xGa_{1-x}$ P (indium gallium phosphide), InAs (indium arsenide), $CuInS_2$ (copper indium sulfide), $CuInSe_2$ (copper indium selenide), $CuInS_xSe_{2-x}$ (copper indium sulfur selenide), $CuIn_xGa_{1-x}S_2$ (copper indium gallium sulfide), $CuIn_xGa_{1-x}Se_2$ (copper indium gallium selenide), $CuIn_xAl_{1-x}Se_2$ (copper indium aluminum selenide), $CuGaS_2$ (copper gallium sulfide) and $CuInS_{2x}ZnS_{1-x}$ (copper indium selenium zinc selenide).

The quantum dots material can comprise core/shell nano-crystals containing different materials in an onion-like structure. For example, the above described exemplary materials can be used as the core materials for the core/shell nano-crystals.

The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium.

In the case of the cadmiun-based quantum dots, e.g. CdSe quantum dots, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2$/ZnS, $CuInS_2$/CdS, $CuInS_2$/$CuGaS_2$, $CuInS_2$/$CuGaS_2$/ZnS and so on.

Figure 2:
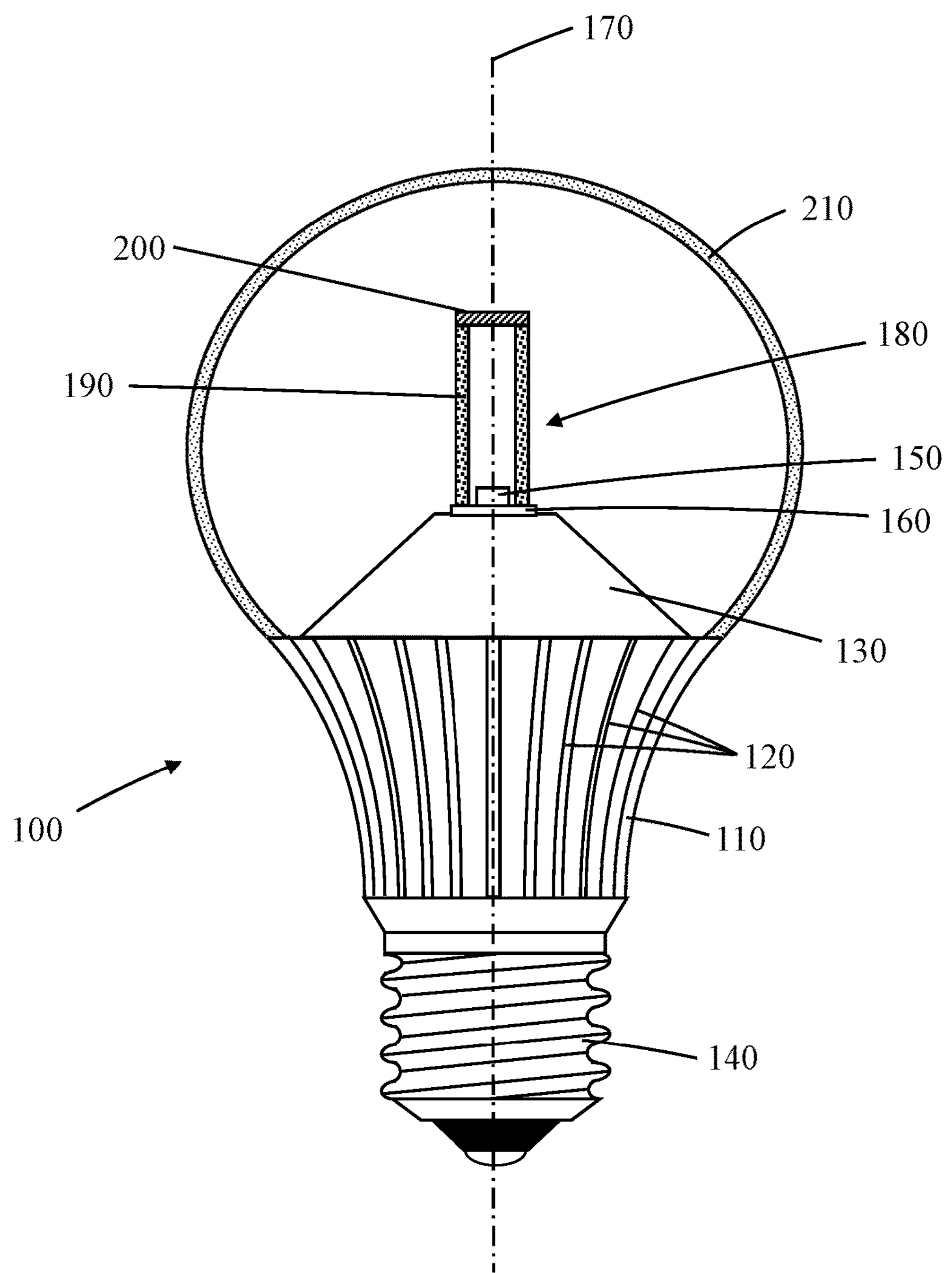
FIG. 2 is schematic partial sectional view of an LED bulb utilizing a hollow photoluminescence wavelength conversion component in accordance with an embodiment of the invention.

As shown in FIG. 2 the photoluminescence wavelength conversion component 150 is mounted over the LED(s) on top of the pedestal 130 and fully encloses the LED(s) 150. The lamp 100 can further comprise a light diffusive envelope or cover 210 mounted to the base of the body and encloses the component 180. The cover 210 can comprise a glass or a light transmissive polymer such as a polycarbonate, acrylic, PET or PVC that incorporates or has a layer of light diffusive (scattering) material. Example of light diffusive materials include particles of Zinc Oxide (ZnO), titanium dioxide ($TiO_2$), barium sulfate ($BaSO_4$), magnesium oxide (MgO), silicon dioxide ($SiO_2$) or aluminum oxide ($Al_2O_3$).

FIG. 3 show a schematic exploded perspective view of the photoluminescence wavelength conversion component 180. As shown in FIG. 3 the component 190 can comprise a hollow cylindrical tube having a bore of diameter Ø and an axial length L. In the exemplary embodiment shown the length of the component is approximately four times the bore diameter of the component and the aspect ratio of the component 180 in an axial direction (ratio of length to bore diameter) is approximately 4:1. The relative dimensions and shape of the component can affect the radial emission pattern of the component and are configured to give a required emission pattern (typically omnidirectional). For an A-19 bulb the bore Ø of the component is between about 1 mm and 10 mm. The photoluminescence material can be homogeniously distributed throughout the volume of the component 190 during manufacture of the component. The wall thickness of the photoluminescence material is typically between 200 μm and 2 mm.

The reflector 200 can comprise a light reflective circular disc that is mounted to the end of the component such that covers the end face of the component. Conveniently the reflector 200 can comprise an injection molded part composed of a light reflective plastics material. Alternatively the reflector can comprise a metallic component or a component with a metallization surface.

Since the component has a constant cross section it can be readily manufactured using an extrusion method. The component can be formed using a light transmissive thermoplastics (thermosoftening) material such as polycarbonate, acrylic or a low temperature glass using a hot extrusion process. Alternatively the component can comprise a thermosetting or UV curable material such as a silicone or epoxy material and be formed using a cold extrusion method. A benefit of extrusion is that it is relatively inexpensive method of manufacture.

Alternatively the component can be formed by injection molding though such a method tends to be more expensive than extrusion. Since the component has a constant cross section it can be formed using injection molding without the need to use an expensive collapsible former. In other embodiments the component can be formed by casting.

Another possible approach is to manufacture the component is by forming a flexible sheet material to include the phosphor and/or quantum dots, and then rolling the sheet material into the desired shape and dimensions for the component. The phosphor may be applied as a layer onto the sheet material, e.g., by coating, printing, or other suitable deposition methods. Alternatively, the phosphor may be incorporated within the material of the flexible sheet.

In operation the LEDs 150 generate blue excitation light a portion of which excite the photoluminescence material within the wavelength conversion component 180 which in response generates by a process of photoluminescence light of another wavelength (color) typically yellow, yellow/green, orange, red or a combination thereof. The portion of blue LED generated light combined with the photoluminescence material generated light gives the lamp an emission product that is white in color.

A particular benefit of photoluminescence components in accordance with embodiments of the invention is that as well as improving the emission distribution pattern they can also improve overall light emission efficiency. For example preliminary tests indicate that the hollow tubular wavelength conversion components described can gives a total light emission that is greater than the known wavelength conversion components. It is believed that the increase in emission efficiency results from the component having a high aspect ratio which it believed reduces the possibility of re-absorption of light by the LED(s) positioned at the opening of the component.

A further advantage of photoluminescence wavelength conversion components in accordance with the invention is that their light emission resembles a filament of a conventional incandescent light bulb.

Figure 4:
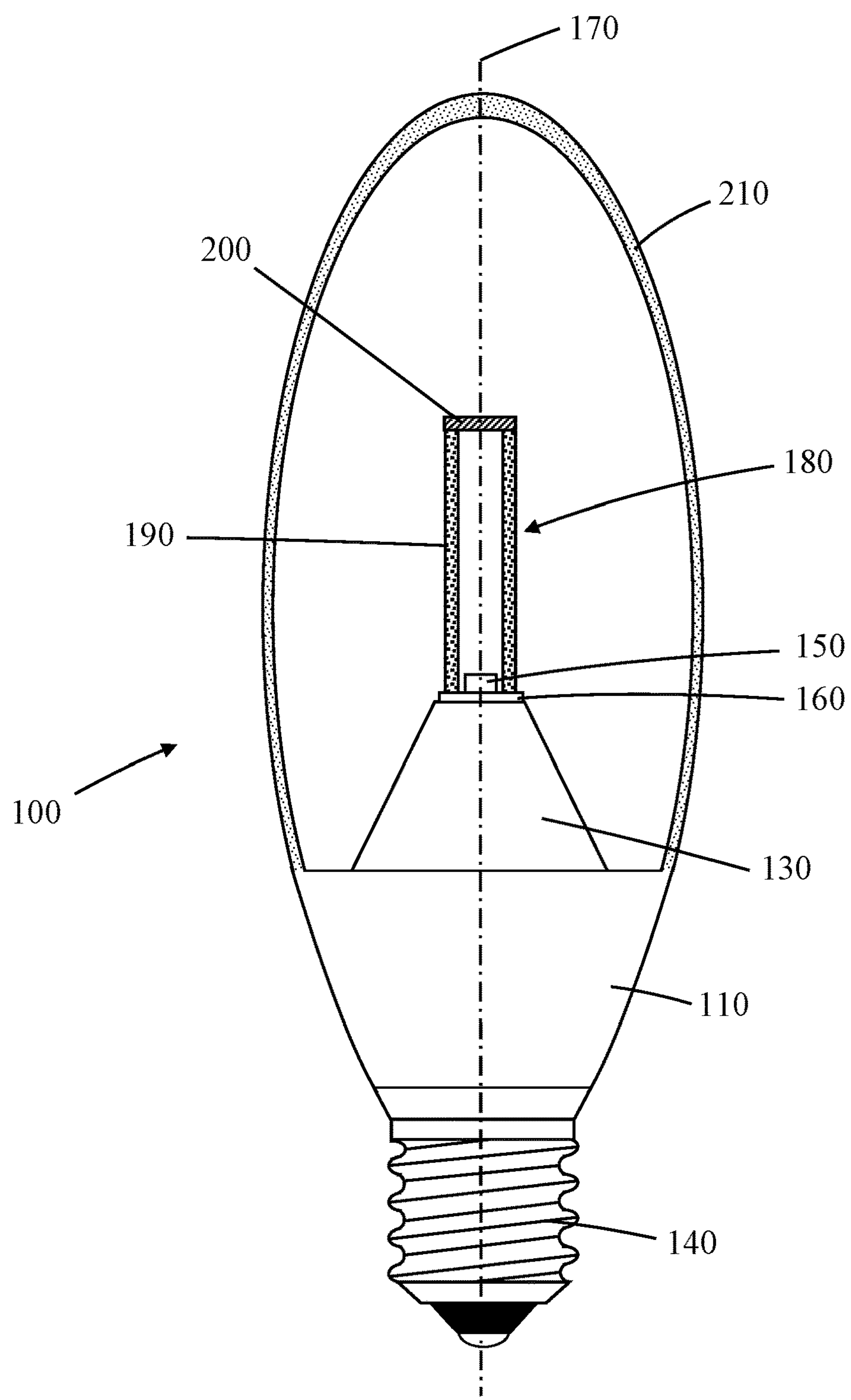
FIG. 4 is a schematic partial sectional view of an LED candle bulb utilizing a hollow photoluminescence wavelength conversion component in accordance with an embodiment of the invention.

FIG. 4 is schematic partial sectional view of an LED candle bulb utilizing a photoluminescence wavelength conversion component in accordance the invention. In this embodiment the photoluminescence wavelength conversion component 180 comprises an elongate tubular component with the photoluminescence material incorporated into the material comprising the component and homogeneously distributed throughout its volume.

Figure 5:
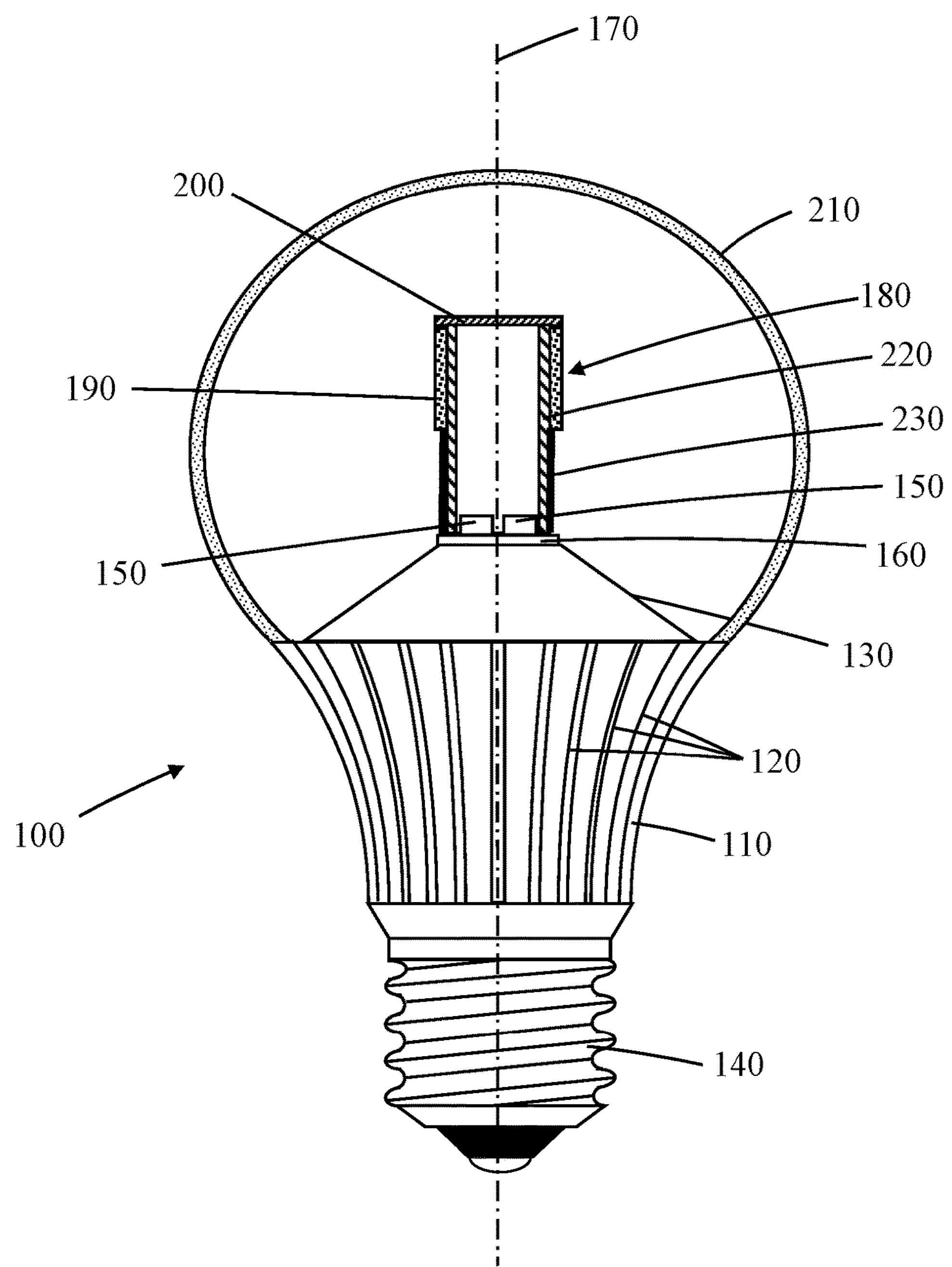
FIG. 5 is a schematic partial sectional view of an LED bulb utilizing a hollow photoluminescence wavelength conversion component in accordance with an embodiment of the invention.

FIG. 5 is a schematic partial sectional view of an LED bulb utilizing a photoluminescence wavelength conversion component in accordance the invention. In this embodiment the photoluminescence wavelength conversion component 180 comprises a tubular component in which the photoluminescence material is incorporated into the material comprising the component. The component 180 is mounted to a hollow light transmissive tube 220 and has a length such that it covers only the end portion of the tube 220 distal to the LED(s) 150. The component 180 can comprise a semi-flexible material and the component, which comprises a sleeve, slipped over the tube 220. Optionally as indicated by heavy solid lines 230 the portion of the tube 220 that is not covered with phosphor (i.e. the portion of the tube proximal to the LED(s)) can include a light reflective surface to prevent light emission from this portion of the tube.

Figure 6:
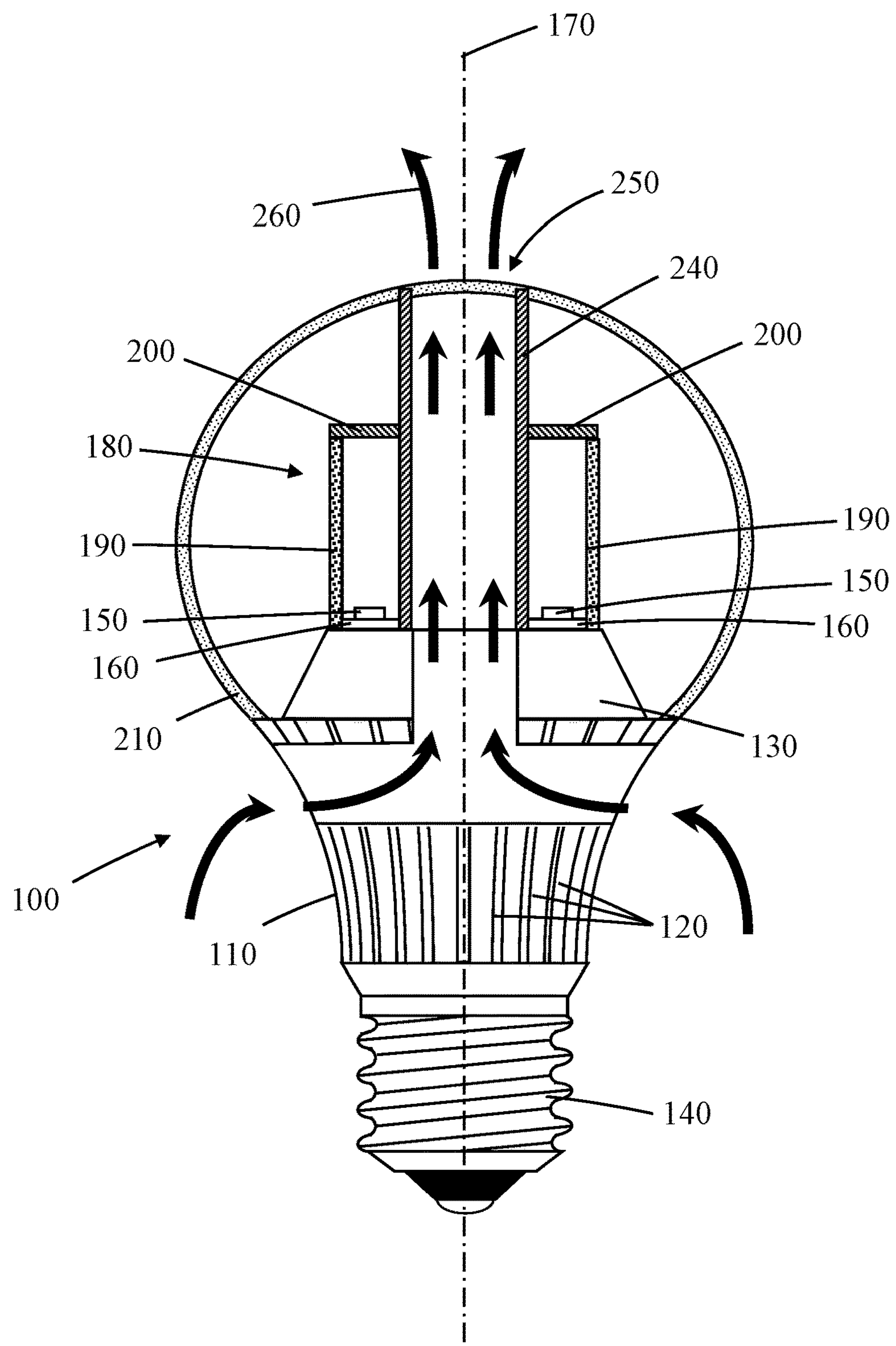
FIG. 6 is a schematic partial sectional view of an LED bulb utilizing a hollow photoluminescence wavelength conversion component in accordance with an embodiment of the invention.

FIG. 6 is a schematic partial sectional view of an LED bulb utilizing a photoluminescence wavelength conversion component in accordance with an embodiment of the invention. In this embodiment the photoluminescence wavelength conversion component 180 comprises a tubular component in which the photoluminescence material is incorporated into the material comprising the component. A plurality of LEDs 150 is mounted on an annular MCPCB 160 an configured as a circular array. A thermally conductive light reflective tubular passage 240 is mounted coaxially within the component and in thermal communication with the pedestal 130 and body 110. The light reflective passage 240 passes through the reflector 200 which is annular in shape and has a circular opening 250 to a surrounding environment. A plurality of openings between the fins 110 are in fluid communication with the interior of the light reflective passage 240 enabling air flow through the passage. In operation heat generated by the LEDs heats air within the passage which through a process of convection causes air to be drawn into and pass through the bulb thereby providing passive cooling of the LEDs. The movement of air by thermal convection is indicated by heavy solid arrows 260.

Whilst the foregoing photoluminescence components comprise a hollow component (i.e. the central region or bore does not include a light transmissive medium) in other embodiments the component can comprise a component having a solid light transmissive core. A component with a light transmissive core can further increase light emission by eliminating or significantly any air interface between the wavelength conversion component 180 and the LEDs 150. This is particularly so for light travelling in a radial direction between walls of the component.

Figure 7:
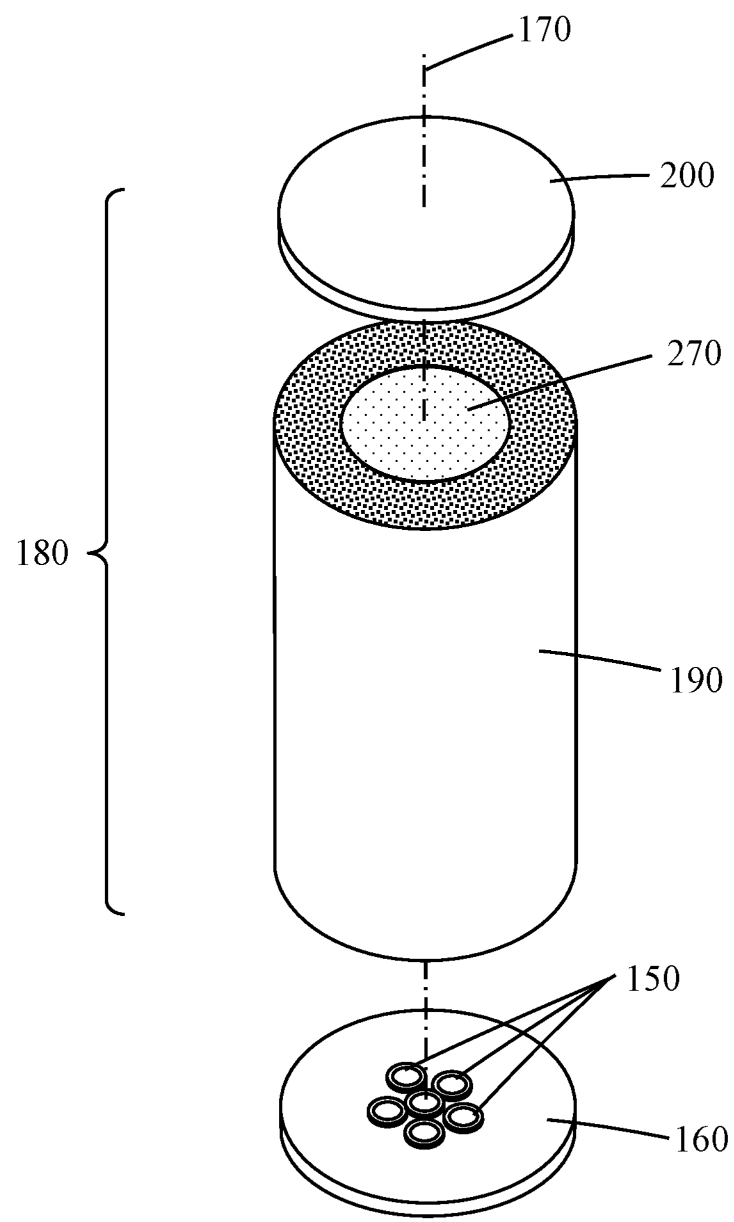
FIG. 7 is a schematic exploded perspective view of a solid photoluminescence wavelength conversion component in accordance with an embodiment of the invention.

FIG. 7 shows a perspective exploded view of a photoluminescence wavelength conversion component in accordance with an embodiment of the invention with a solid core. In this embodiment the component comprises a solid cylindrical shaped component composed of a cylindrical light transmissive core 270 and an outer coaxial phosphor layer 190.

Such a component can be formed by co-extrusion of the core 270 and phosphor layers 190. Alternatively the component can be manufactured by fabricating the component of FIG. 3 and then inserting a light transmissive cylindrical rod, such as a glass rod, into the bore of the component. In other embodiments the component can be fabricated by coating the phosphor material onto the outer surface of a light transmissive rod such as a glass or polycarbonate rod. In some embodiments the component is fabricated from a resiliently deformable (semi-flexible) light transmissive material such as a silicone material. A benefit of using a resiliently deformable material is that this can assist in insertion of the rod.

Where the component comprises a solid component, the reflector 200 can comprise a coating, such as a light reflective paint or metallization layer, that is applied directly to the end face of the component.

Figure 8A:
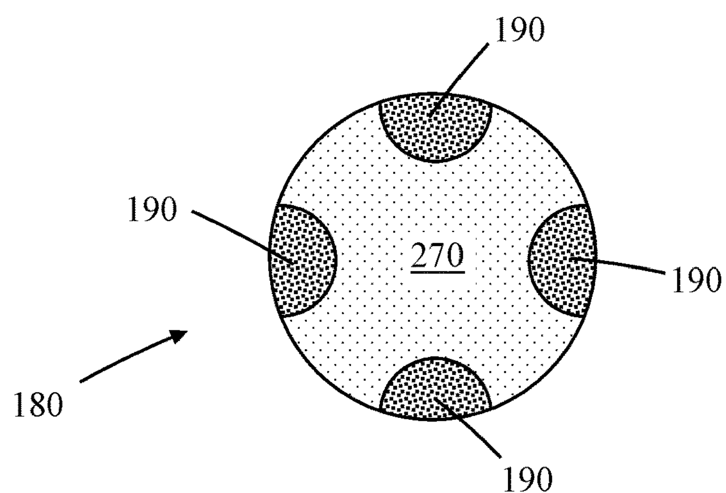
FIGS. 8A and 8B respectively show schematic end and perspective views of a solid photoluminescence wavelength conversion component in accordance with an embodiment of the invention.
Figure 8B:
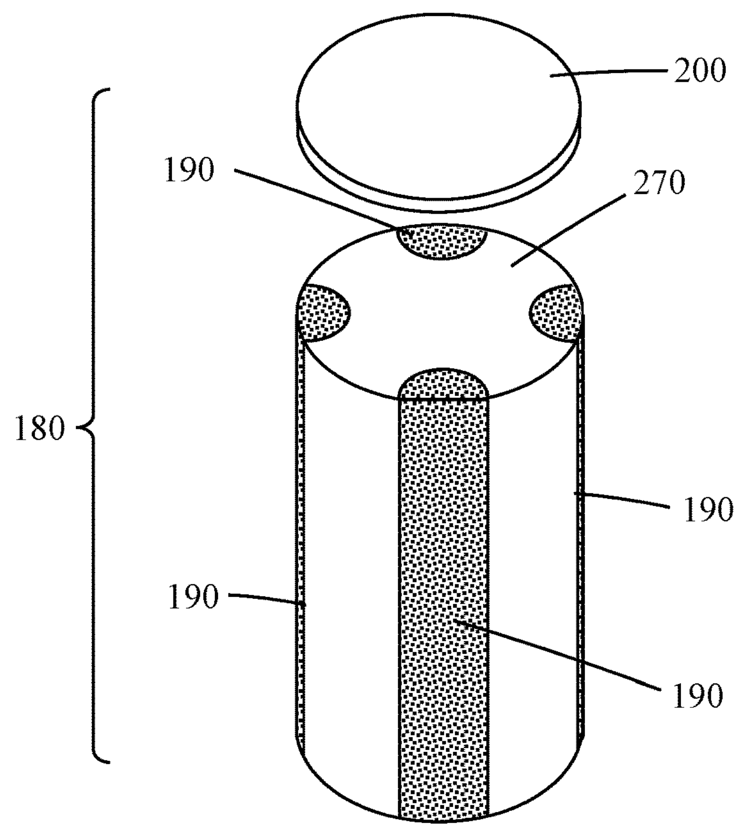

FIGS. 8A and 8B show schematic perspective and end views of a photoluminescence wavelength conversion component in accordance with an embodiment of the invention. As can be seen in the embodiment illustrated in FIGS. 8A-B the component comprises a cylindrical light transmissive component 270 with latitudinally extending phosphor regions (strips) 190. FIGS. 8A and 8B show four phosphor regions 190 that are equally circumferentially spaced though it will be appreciated that the number, shape and configuration of the phosphor regions can be varied within the scope of the invention.

Figure 9:
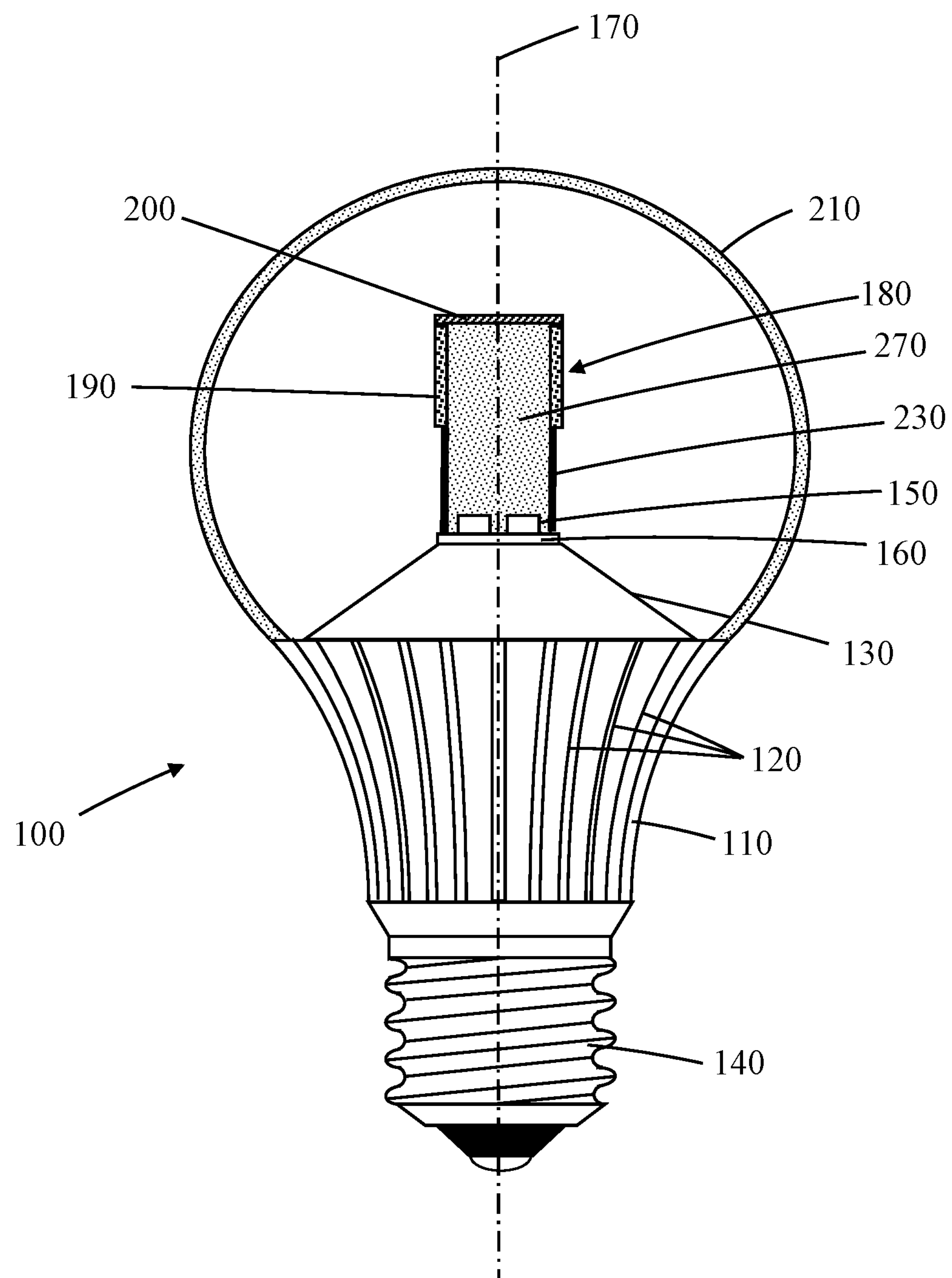
FIG. 9 is a schematic partial sectional view of an LED bulb utilizing a solid photoluminescence wavelength conversion component in accordance with an embodiment of the invention.

FIG. 9 is a schematic partial sectional view of an LED bulb utilizing a solid photoluminescence wavelength conversion component in accordance with an embodiment of the invention. In this embodiment the photoluminescence wavelength conversion component 180 comprises has a solid core 270 with a phosphor layer 190 covering an end portion distal to the LED(s) 150. The phosphor layer 190 can comprise a semi-flexible material which is slipped over the core 270. Optionally as indicated by heavy solid lines 230 the portion of the core 270 that is not covered with phosphor (i.e. the portion of the tube proximal to the LED(s)) can include a light reflective surface to prevent light emission from this portion of the core.

Whilst the invention arose in relation to and finds particular application to light bulbs, photoluminescence wavelength conversion components of the invention can be utilized in other light emitting devices and lighting arrangements such as for example linear lamps.

Figure 10:
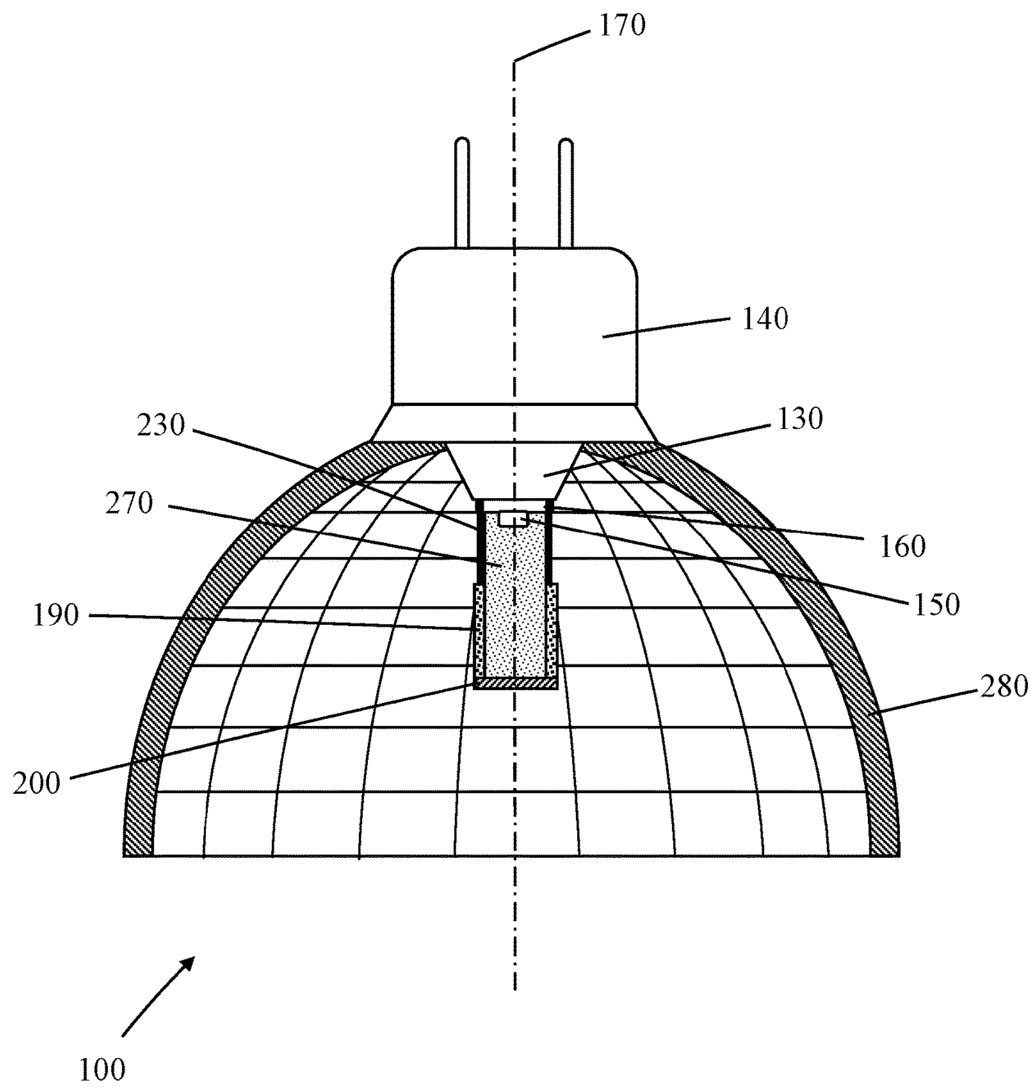
FIG. 10 is a schematic partial sectional view of an LED reflector lamp utilizing a solid photoluminescence wavelength conversion component in accordance with an embodiment of the invention.

FIG. 10 is a schematic partial sectional view of an LED reflector lamp, such as an MR16 lamp. In this embodiment the photoluminescence wavelength conversion component 180 comprises has a solid core 270 with a phosphor layer 190 covering an end portion distal to the LED(s) 150. Optionally as indicated by heavy solid lines 230 the portion of the core 270 that is not covered with phosphor (i.e. the portion of the tube proximal to the LED(s)) can include a light reflective surface to prevent light emission from this portion of the core. The light emitting portion of the component is located at or near the focal point of a multifaceted reflector 280.

Figure 11:
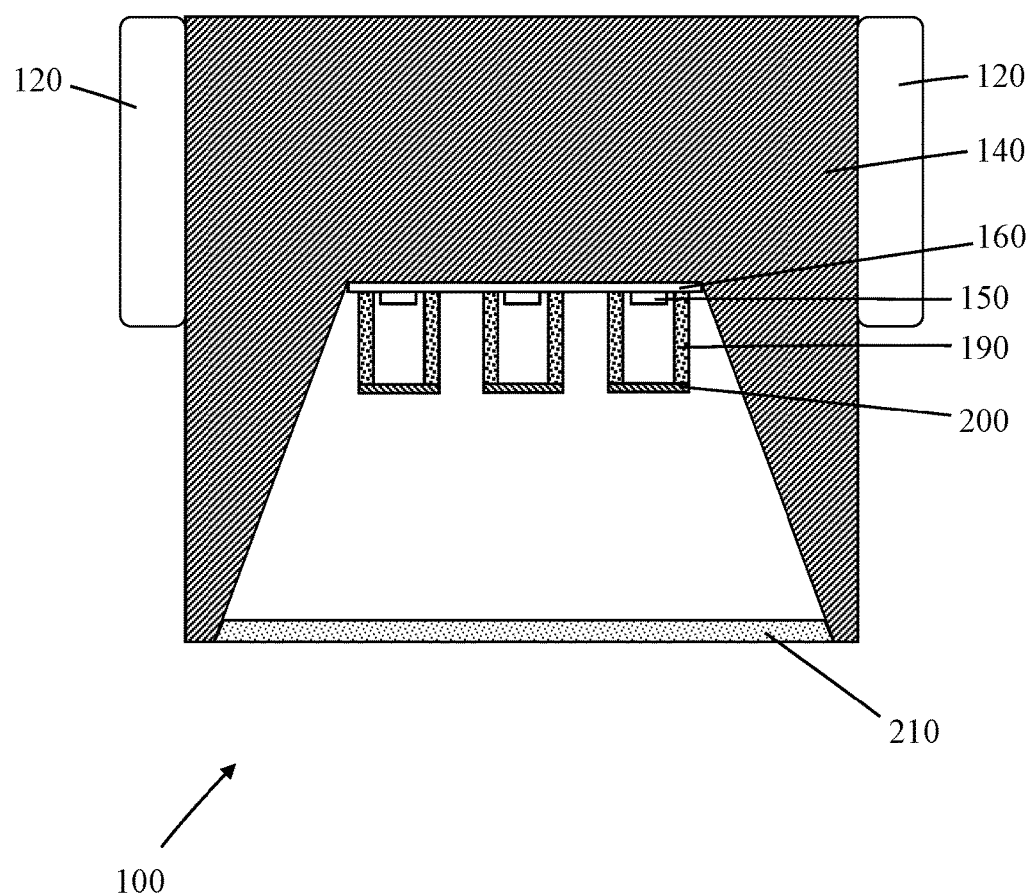
FIG. 11 is a schematic partial sectional view of an LED downlight utilizing multiple hollow photoluminescence wavelength conversion components in accordance with an embodiment of the invention.

FIG. 11 is a schematic partial sectional view of an LED downlight utilizing multiple hollow photoluminescence wavelength conversion component in accordance with an embodiment of the invention. In this embodiment, some or all of the photoluminescence wavelength conversion components 180 comprise an elongate hollow tubular component with the photoluminescence material incorporated into the material comprising the component and homogeneously distributed throughout its volume.

Figure 12:
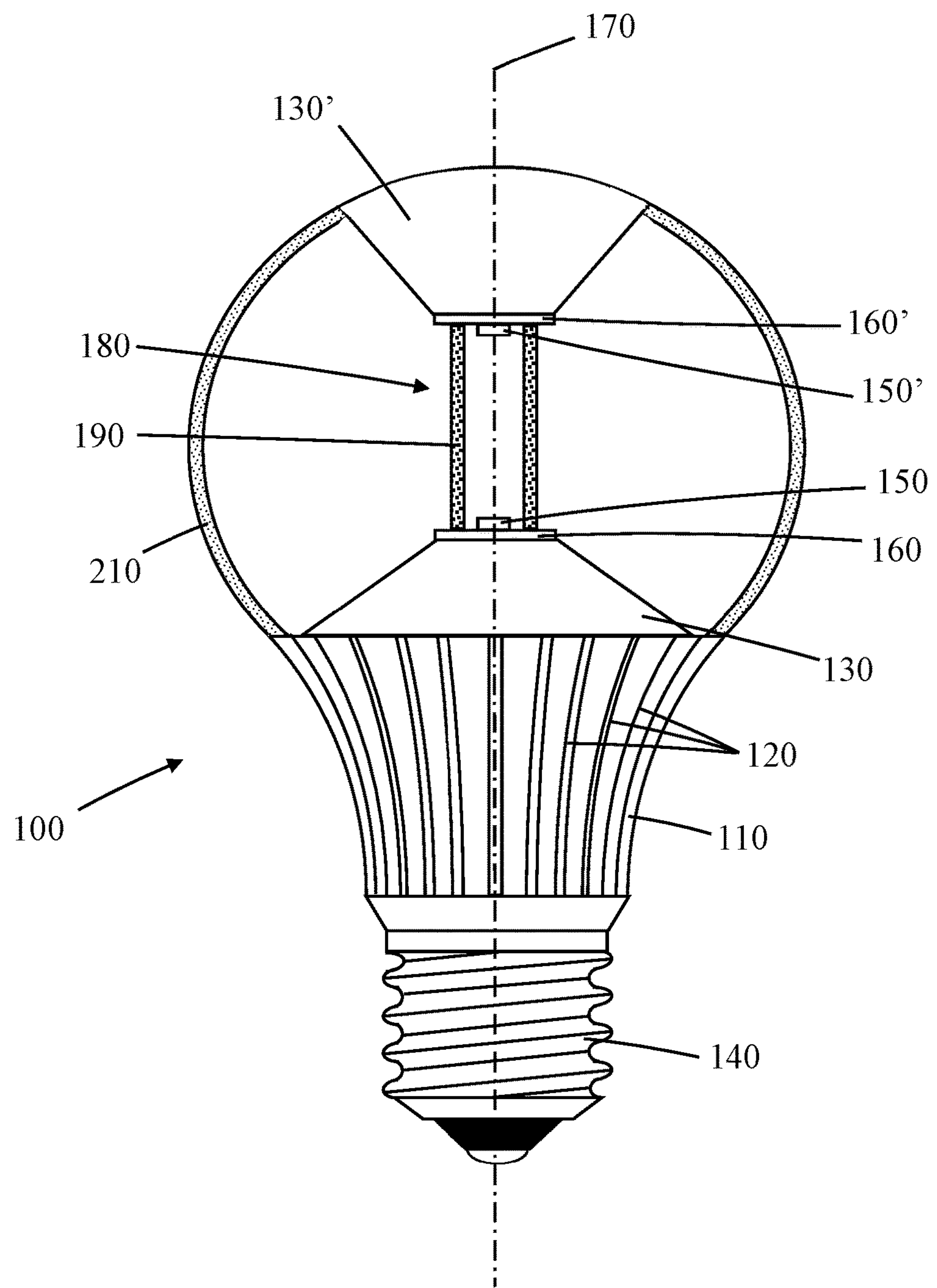
FIG. 12 is a schematic partial sectional view of an LED bulb utilizing a hollow photoluminescence wavelength conversion component in accordance with an embodiment of the invention.

In each of foregoing embodiments the components comprises a first proximal end for receiving light and a reflector on the distal end. It is envisioned in further embodiments that each end of the component is configured to receive light thereby eliminating the need for the reflector. FIG. 12 is a schematic partial sectional view of an LED bulb utilizing a hollow photoluminescence wavelength conversion component having LEDs located at both ends. In this embodiment the photoluminescence wavelength conversion component 180 comprises an elongate hollow tubular component with the photoluminescence material incorporated into the material comprising the component and homogeneously distributed throughout its volume. A first LED(s) are located at a first end of the component and a second LED(s) at the opposite end of the component.

Figure 13:
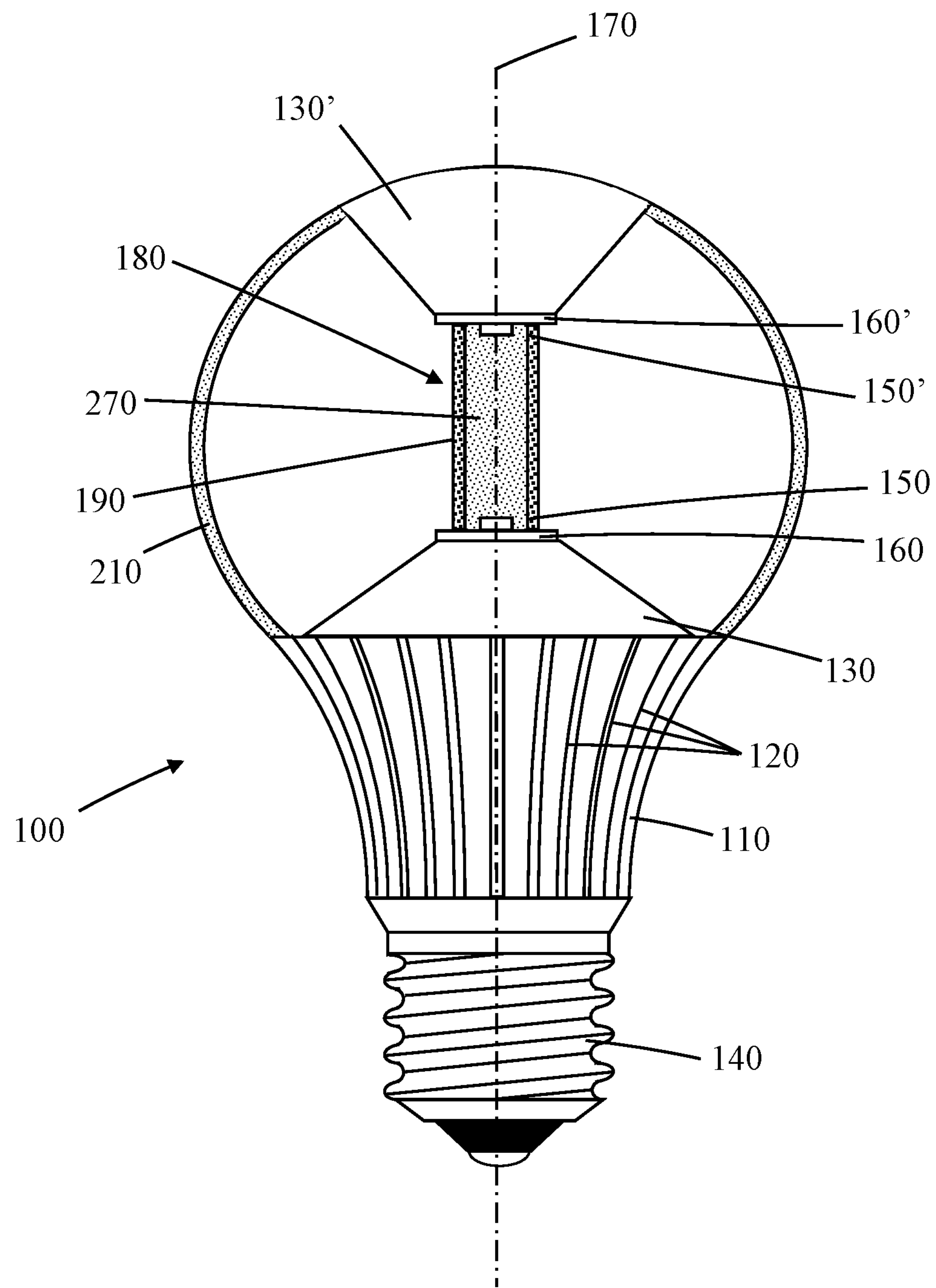
FIG. 13 is a schematic partial sectional view of an LED bulb utilizing a solid photoluminescence wavelength conversion component in accordance with an embodiment of the invention.

FIG. 13 is a schematic partial sectional view of an LED bulb utilizing a solid photoluminescence wavelength conversion component 180 having LEDs located at both ends. In this embodiment the component 180 can comprise the solid component of FIG. 7.

Figure 14:
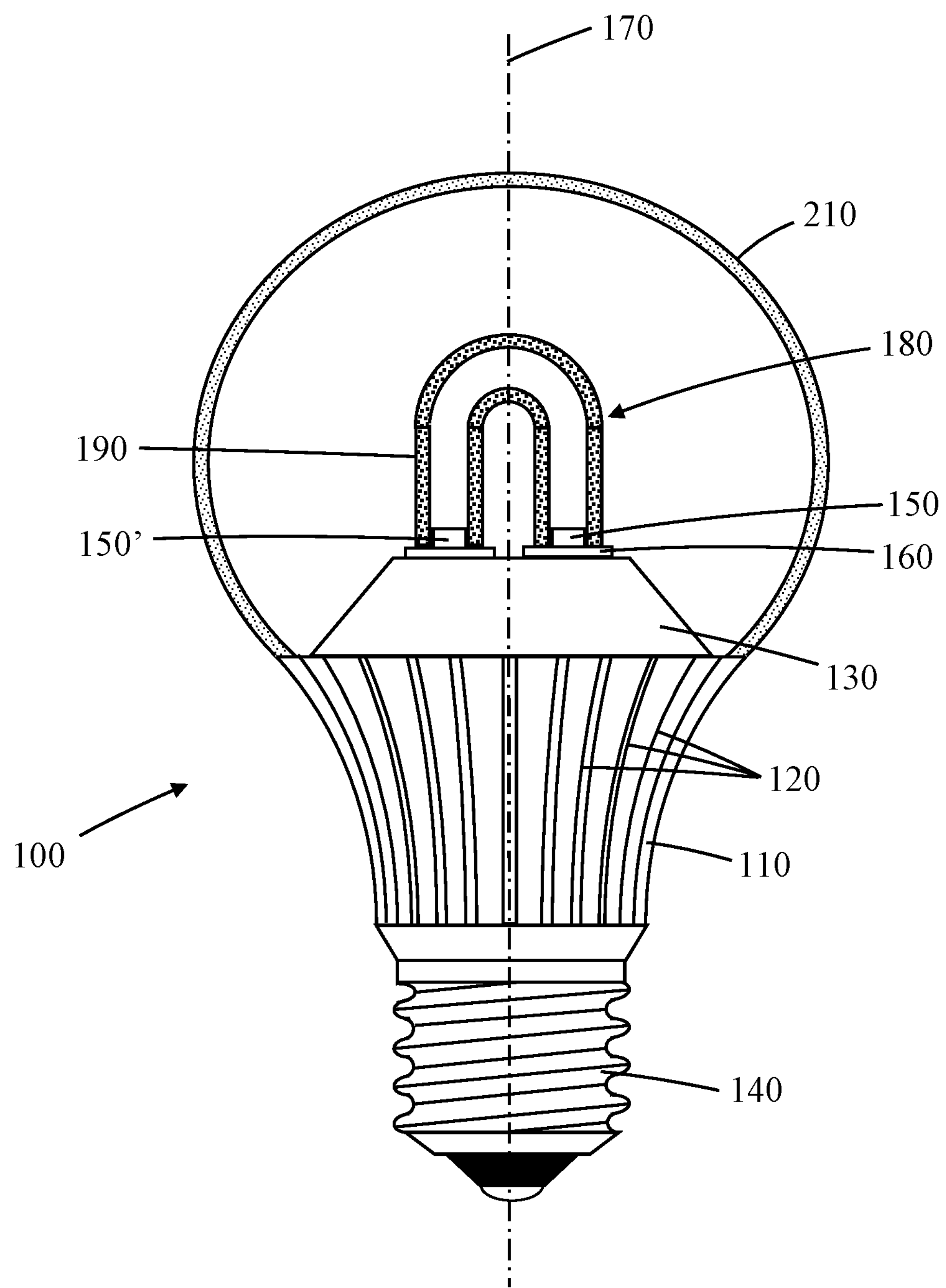
FIG. 14 is a schematic partial sectional view of an LED bulb utilizing a hollow photoluminescence wavelength conversion component in accordance with an embodiment of the invention.

FIG. 14 is a schematic partial sectional view of an LED bulb utilizing a hollow photoluminescence wavelength conversion component 180 having LEDs located at both ends. In this embodiment the component 180 comprises a tubular component whose ends are looped around such that both ends share a common plane.

Figure 15:
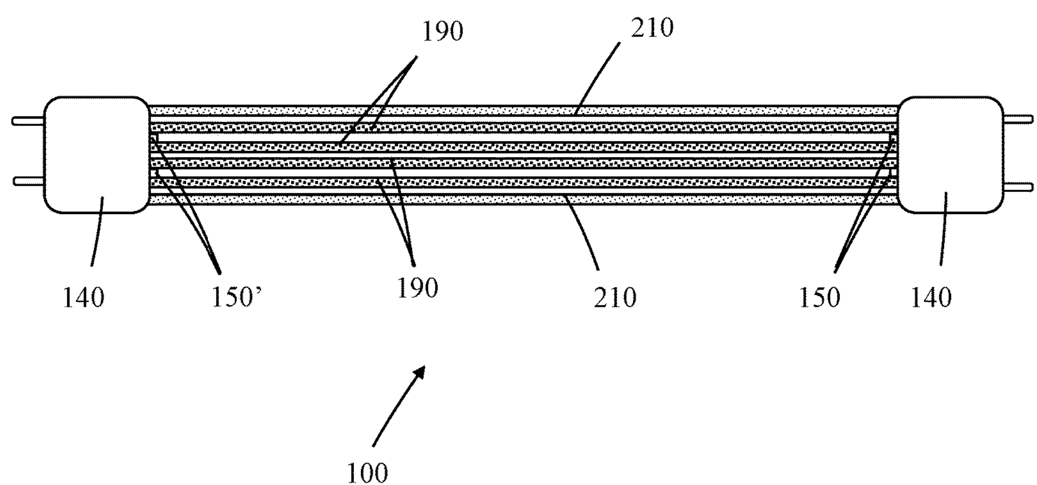
FIG. 15 is a schematic partial sectional view of an LED linear lamp utilizing multiple hollow photoluminescence wavelength conversion components in accordance with an embodiment of the invention.

FIG. 15 is a schematic partial sectional view of an LED linear lamp utilizing multiple hollow photoluminescence wavelength conversion components in accordance with an embodiment of the invention. In this embodiment each photoluminescence wavelength conversion component 180 comprises an elongate hollow tubular component with the photoluminescence material incorporated into the material comprising the component and homogeneously distributed throughout its volume.

It will be appreciated that the invention is not limited to the exemplary embodiments described and that variations can be made within the scope of the invention. For example whilst in the embodiments described the photoluminescence wavelength conversion component has a circular cross section, the component can have other cross sections such as elliptical, triangular, square, pentagonal, hexagonal.

What is claimed is:

1. A photoluminescence wavelength conversion component comprising:

a cylindrical light transmissive component comprising a plurality of latitudinally extending phosphor regions which are equally circumferentially spaced and have at least one photoluminescence material;

the cylindrical light transmissive component having first and second ends and a substantially constant cross section, wherein the first end is for receiving light; and a light reflective surface provided over at least a part of the second end, wherein the light transmissive component comprises a solid component with a light transmissive core.

2. The photoluminescence wavelength conversion component of claim 1, wherein the plurality of latitudinally extending phosphor regions project into the light transmissive core.

3. The photoluminescence wavelength conversion component of claim 1, wherein the plurality of latitudinally extending phosphor regions have a semi-circular cross section.

4. The photoluminescence wavelength conversion component of any one of claims 1 to 3, wherein the cylindrical light transmissive component is elongate.

5. The photoluminescence wavelength conversion component of claim 4, wherein the ratio of the length of the cylindrical light transmissive component to width is at least two to one.

6. The photoluminescence wavelength conversion component of claim 4, wherein the ratio of the length of the cylindrical light transmissive component to width is at least four to one.

7. The photoluminescence wavelength conversion component of claim 1, wherein the cylindrical light transmissive component has a circular cross section.

8. The photoluminescence wavelength conversion component of claim 1, wherein the cylindrical light transmissive component has an elliptical, triangular, square, pentagonal, or hexagonal cross section.

9. The photoluminescence wavelength conversion component of claim 1, wherein the cylindrical light transmissive component is manufactured using a process selected from the group consisting of: extrusion; injection molding; and casting.

10. The photoluminescence wavelength conversion component of claim 1, wherein light emission of the component resembles that of a filament of an incandescent light bulb.

11. The photoluminescence wavelength conversion component of claim 1, wherein the at least one photoluminescence material is incorporated in and homogeneously distributed throughout a volume of the plurality of latitudinally extending phosphor regions.

12. The photoluminescence wavelength conversion component of claim 1, wherein the cylindrical light transmissive component is located with at least one solid-state light source operable to generate excitation light and configured to emit excitation light into the first end of the component.

13. The photoluminescence wavelength conversion component of claim 12, wherein the cylindrical light transmissive component and the at least one solid-state light source are incorporated into a lamp.

* * * * *